(12) United States Patent
Cho et al.

(10) Patent No.: US 10,943,546 B2
(45) Date of Patent: Mar. 9, 2021

(54) THIN-FILM TRANSISTOR ARRAY SUBSTRATE AND ELECTRONIC DEVICE INCLUDING THE SAME

(71) Applicant: LG DISPLAY CO., LTD., Seoul (KR)

(72) Inventors: InTak Cho, Gyeonggi-do (KR); PilSang Yun, Gyeonggi-do (KR); Jeyong Jeon, Gyeonggi-do (KR); Jiyong Noh, Gyeonggi-do (KR); SeHee Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/694,674

(22) Filed: Nov. 25, 2019

(65) Prior Publication Data
US 2020/0184903 A1    Jun. 11, 2020

(30) Foreign Application Priority Data
Dec. 10, 2018 (KR) .................. 10-2018-0158517

(51) Int. Cl.
*G09G 3/3291* (2016.01)
*G09G 3/3266* (2016.01)
*H01L 27/32* (2006.01)

(52) U.S. Cl.
CPC ......... *G09G 3/3291* (2013.01); *G09G 3/3266* (2013.01); *H01L 27/3262* (2013.01); *H01L 27/3265* (2013.01); *H01L 27/3276* (2013.01); *H01L 2227/323* (2013.01)

(58) Field of Classification Search
CPC ................. G09G 3/3241; H01L 27/3274
See application file for complete search history.

(56) References Cited

U.S. PATENT DOCUMENTS

| | | | |
|---|---|---|---|
| 2007/0254402 A1 | 11/2007 | Dimmier et al. | |
| 2008/0239183 A1 | 10/2008 | Luo et al. | |
| 2014/0158995 A1 | 6/2014 | Park | |
| 2015/0145840 A1* | 5/2015 | Lim | H01L 27/1446 345/207 |
| 2017/0005200 A1 | 1/2017 | Sasaki | |
| 2017/0054111 A1* | 2/2017 | Kim | H01L 27/3276 |
| 2017/0256649 A1 | 9/2017 | Takamaru et al. | |

FOREIGN PATENT DOCUMENTS

| | | |
|---|---|---|
| JP | 2013-21349 A | 1/2013 |
| JP | 2015-135977 A | 7/2015 |
| JP | 2017-17208 A | 1/2017 |
| WO | WO 2016/170355 A1 | 10/2016 |
| WO | WO 2017/152644 A1 | 9/2017 |

* cited by examiner

*Primary Examiner* — Kevin M Nguyen
(74) *Attorney, Agent, or Firm* — Birch, Stewart, Kolasch & Birch, LLP

(57) ABSTRACT

An electronic device includes a panel including first and second transistors and a driver circuit driving the panel. The first transistor includes a first electrode disposed on a substrate, a first insulating film disposed on the substrate and having an open area, a second electrode disposed on the first insulating film and overlapping the first electrode, and a first active layer disposed on the first and second electrodes. The second transistor includes third and fourth electrodes which are disposed to space apart from, and on a same layer as, the second electrode, and between which the open area is disposed, and a second active layer disposed on the third and fourth electrodes and across the open area.

25 Claims, 17 Drawing Sheets

THIN-FILM TRANSISTOR ARRAY SUBSTRATE AND ELECTRONIC DEVICE INCLUDING THE SAME

CROSS REFERENCE TO RELATED APPLICATION

This application claims priority to Korean Patent Application No. 10-2018-0158517, filed in the Republic of Korea on Dec. 10, 2018, which is hereby incorporated by reference for all purposes as if fully set forth herein.

BACKGROUND

Field

Example embodiments relate to a thin-film transistor array substrate and an electronic device including the same.

Description of Related Art

In response to the development of the information society, a variety of demands for a range of electronic devices, such as a display device and a lighting device, are increasing. Such an electronic device may include a panel in which data lines and gate lines are disposed, a data driver driving the data lines, and a gate driver driving the gate lines.

A panel, a key component of an electronic device may include a large number of transistors having a variety of functions to drive the panel.

Accordingly, panel fabrication processing may inevitably be complicated and difficult. However, if ease of processing is pursued, the performance of transistors may be degraded, which is problematic.

In addition, transistors should have high levels of integration to realize superior characteristics in electronic devices, such as high resolution. However, the size of transistors cannot be endlessly reduced, due to problems associated with processing, design, and the like. Therefore, it is desirable to provide a transistor structure by which an electronic device can have high resolution.

BRIEF SUMMARY

Various aspects of the present disclosure provide a thin-film transistor array substrate and an electronic device including the same, in which at least one transistor, among a plurality of transistors disposed in a panel, has a structure by which a short channel and integration can be realized.

Also provided are a thin-film transistor array substrate and an electronic device including the same, in which at least one transistor, among a plurality of transistors disposed in a panel, has a structure by which an operating margin is increased due to a high S-factor.

Also provided are a thin-film transistor array substrate and an electronic device including the same, in which the thin-film transistor array substrate includes a transistor having a structure by which an ultra-high resolution panel can be realized due to a reduced device area.

Also provided are a thin-film transistor array substrate and an electronic device including the same, in which the thin-film transistor array substrate includes a transistor having a structure by which an active layer and an insulating film are protected from a break, e.g., a discontinuity in an electrical circuit.

Also provided are a thin-film transistor array substrate and an electronic device including the same, in which the thin-film transistor array substrate includes a storage capacitor having increased capacity.

According to an aspect of the present disclosure, an electronic device can include a panel, and a driver circuit driving the panel.

In the electronic device including a panel and a driver circuit driving the panel, according to example embodiments, first and second transistors disposed in the panel can include: a first electrode of the first transistor, the first electrode being disposed on a substrate; a first insulating film disposed on the substrate, overlapping one end of the first electrode, and having at least one open area; a second electrode of the first transistor, the second electrode being disposed on the first insulating film to overlap a portion of the first electrode; a third electrode and a fourth electrode of the second transistor, the third electrode and the fourth electrode being disposed on the same layer as the second electrode to be spaced apart from the second electrode, with the open area of the first insulating film being disposed between the third electrode and the fourth electrode; a first active layer of the first transistor, the first active layer being disposed on the first electrode, the first insulating film, and the second electrode; a second active layer of the second transistor, the second active layer being disposed on the third electrode and the fourth electrode, along the open area of the first insulating film; a second insulating film disposed on the first active layer, the second active layer and the third electrode; and a first gate electrode of the first transistor and a second gate electrode of the second transistor, the first gate electrode being disposed on the second insulating film and overlapping the first active layer, and the second gate electrode being disposed on the second insulating film and overlapping the second active layer.

A plurality of data lines can intersect a plurality of gate lines within the panel, and the first active layer of the first transistor can overlap one data line among the plurality of data lines and one gate line among the plurality of gate lines.

The electronic device can further include: a second plate disposed on a first plate integral with the third electrode; a third insulating film disposed on the second plate; and a third plate disposed on the third insulating film.

The first plate and the third plate can be electrically connected via a second hole provided in the second and third insulating films.

The second and third insulating films can have a smaller thickness variation than the first insulating film.

The second and third insulating films can have a higher level of density than the first insulating film.

One of the first electrode and the second electrode of the first transistor can be electrically connected to the second gate electrode of the second transistor and a storage capacitor.

A data voltage can be applied to the second transistor.

The first active layer can include a first channel area, the first channel area being in contact with a side surface of the first insulating film. The second active layer can include a second channel area, the second channel area overlapping the second gate electrode.

The panel can further include: a third transistor disposed on the substrate, the third transistor includes a fifth electrode disposed on the substrate; the first insulating film exposing one end of the fifth electrode and a portion of a top surface of the substrate; a sixth electrode disposed on the first insulating film; a third active layer of the third transistor, disposed on the sixth electrode, the first insulating film, and the fifth electrode, and including a third channel area contacting a side surface of the first insulating film; the second insulating film disposed on the third active layer; and a third gate electrode disposed on the second insulating film and overlapping the third active layer.

A plurality of reference voltage lines can be disposed within the panel to be parallel to the plurality of data lines intersecting a plurality of gate lines, and the third active layer can overlap one reference voltage line among the plurality of reference voltage lines and one gate line among the plurality of gate lines.

The gate line, which the third active layer overlaps, can correspond to one gate line, among the plurality of gate lines, which the first active layer overlaps.

The gate line, which the third active layer overlaps, can be different from one gate line, among the plurality of gate lines, which the first active layer overlaps.

According to embodiments, in the thin-film transistor array substrate and the electronic device including the same, at least one transistor, among a plurality of transistors disposed in a panel, has a structure by which a short channel and integration can be realized.

According to embodiments, in the thin-film transistor array substrate and the electronic device including the same, at least one transistor, among a plurality of transistors disposed in a panel, has a structure by which an operating margin is increased due to a high S-factor.

According to embodiments, the thin-film transistor array substrate includes a transistor having a structure by which an ultra-high resolution panel can be realized due to a reduced device area, and the electronic device includes the same thin-film transistor array substrate.

According to embodiments, the thin-film transistor array substrate includes a transistor having a structure by which an active layer and an insulating film are protected from a break, e.g., no discontinuity in an electrical circuit, and the electronic device includes the same thin-film transistor array substrate.

According to example embodiments, the thin-film transistor array substrate includes a storage capacitor having increased capacity, and the electronic device includes the same thin-film transistor array substrate.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION

Figure 1:
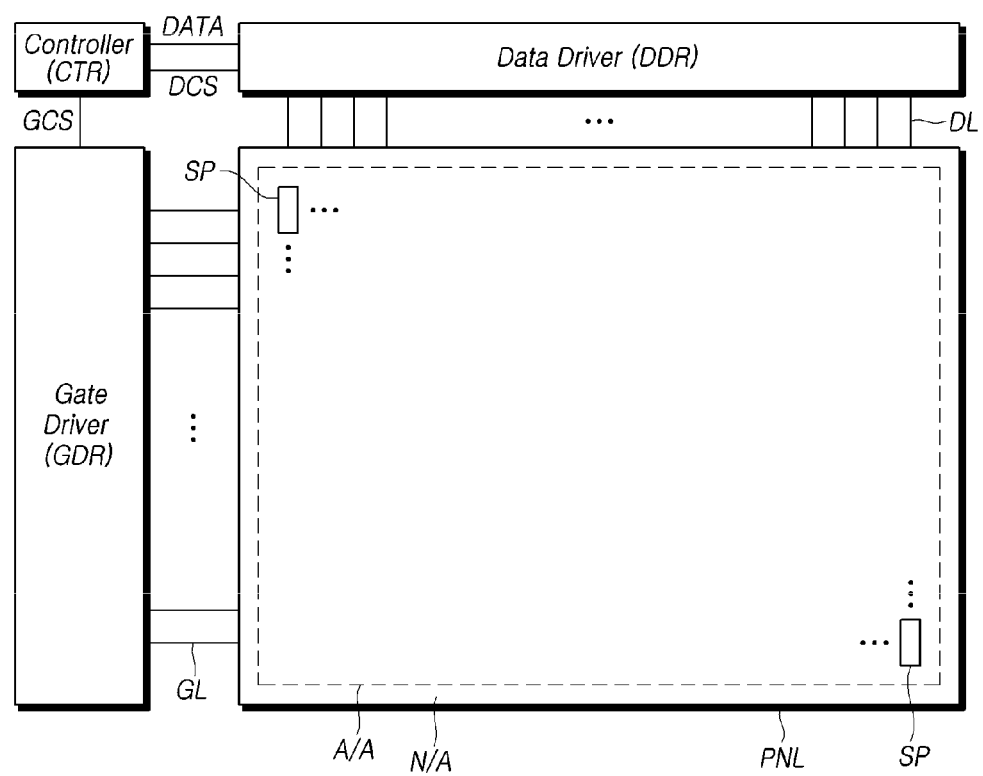
FIG. 1 illustrates a schematic configuration of an electronic device according to embodiments.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in many different forms. Rather, these embodiments are provided so that the present disclosure will be thorough and complete, and will fully convey the scope of the present disclosure to a person having ordinary skill in the art. The scope of the present disclosure shall be defined by the appended Claims.

The shapes, sizes, ratios, angles, numbers, and the like, inscribed in the drawings to illustrate embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element. In the same context, it will be understood that when an element is referred to as being formed "on," "above," "under," or "next to" another element, not only can it be directly located on or under the other element, but it can also be indirectly located on or under the other element via an intervening element.

In addition, terms, such as "first" and "second" may be used herein to describe a variety of components. It should be understood, however, that these components are not limited by these terms. These terms are merely used to discriminate one element or component from other elements or components. Thus, a first element referred to as first hereinafter may be a second element within the spirit of the present disclosure.

The features (or components) of embodiments of the present disclosure may be partially or entirely coupled or combined with each other and may work in concert with each other or may operate in a variety of technical methods. In addition, respective embodiments may be carried out independently or may be associated with and carried out in concert with other embodiments.

Hereinafter, embodiments will be described in detail with reference to the accompanying drawings.

FIG. 1 illustrates a schematic configuration of an electronic device according to embodiments.

The electronic device according to embodiments can include a display device, a lighting device, a light-emitting device, and the like. The following description will mainly be focused on the display device for the sake of brevity. However, the following description can be applied not only to the display device, but also to various other electronic devices, such as the lighting device or the light-emitting device, in substantially the same manner, as long as transistors are included.

The electronic device according to embodiments can include a panel PNL displaying images or emitting light and driver circuits driving the panel PNL.

In the panel PNL, a plurality of data lines DL and a plurality of gate lines GL can be disposed, and a plurality of subpixels SP, defined by intersections of the plurality of gate lines and the plurality of data lines, can be arrayed in the form of a matrix.

In the panel PNL, the plurality of data lines DL and the plurality of gate lines GL can be disposed to intersect each other. For example, the plurality of gate lines GL can be arrayed in rows or columns, while the plurality of data lines DL can be arrayed in columns or rows. In the following description, the plurality of gate lines GL will be regarded as being arrayed in rows, while the plurality of data lines DL will be regarded as being arrayed in columns, for the sake of brevity.

Various signal lines, other than the plurality of data lines DL and the plurality of gate lines GL, can be disposed in the panel PNL, depending on the subpixel structure or the like. Driving voltage lines, reference voltage lines, common voltage lines, and the like can further be disposed.

The panel PNL can be one of various types of panels, such as a liquid crystal display (LCD) panel and an organic light-emitting diode (OLED) panel.

Types of signal lines disposed in the panel PNL can vary depending on the subpixel structure, the panel type (e.g., an LCD panel or an OLED panel), or the like. In addition, the term "signal lines" used herein can conceptually include electrodes to which signals are applied.

The panel PNL can include an active area A/A in which images are displayed and a non-active area N/A in which no images are displayed, the non-active area N/A being located in the periphery of the active area A/A. Herein, the non-active area N/A is also referred to as a bezel area.

The plurality of subpixels SP displaying images are disposed in the active area A/A.

A pad assembly can be disposed in the non-active area N/A, with a data driver DDR being electrically connected to the pad assembly. A plurality of data link lines connecting the pad assembly and the plurality of data lines DL can be disposed in the non-active area N/A. Herein, the plurality of data link lines can be extensions of the plurality of data lines DL into the non-active area N/A or separate patterns electrically connected to the plurality of data lines DL.

In addition, gate driving-related lines can be disposed in the non-active area N/A to transfer voltages (or signals) for gate driving to a gate driver GDR via the pad assembly to which the gate driver GDR is electrically connected. For example, the gate driving-related lines can include clock lines, through which clock signals are transferred, gate voltage lines, through which gate voltages VGH and VGL are transferred, gate driving control signal lines, through which a variety of control signals for the generation of a scanning signal are transferred, and the like. These gate driving-related lines are disposed in the non-active area N/A, unlike the gate lines GL disposed in the active area A/A.

The driver circuits can include the data driver DDR driving the plurality of data lines DL, the gate driver GDR driving the plurality of gate lines GL, a controller CTR controlling the data driver DDR and the gate driver GDR, and the like.

The data driver DDR can drive the plurality of data lines DL by outputting data voltages to the plurality of data lines DL.

The gate driver GDR can drive the plurality of gate lines GL by outputting a scanning signal to the plurality of gate lines GL.

The controller CTR can control the driving operations of the data driver DDR and the gate driver GDR by supplying a variety of control signals DCS and GCS for the driving operations of the data driver DDR and the gate driver GDR. In addition, the controller CTR can supply image data DATA to the data driver DDR.

The controller CTR starts scanning at points in time realized by respective frames, converts image data input from an external source into image data DATA having a data signal format readable by the data driver DDR, outputs the converted image data DATA, and controls data driving at appropriate points in time according to the scanning.

The controller CTR receives timing signals, including a vertical synchronization signal (Vsync), a horizontal synchronization signal (Hsync), an input data enable signal (DE), a clock signal CLK, and the like, from an external source (e.g., a host system), generates a variety of control signals, and outputs the variety of control signals to the data driver DDR and the gate driver GDR in order to control the data driver DDR and the gate driver GDR.

For example, the controller CTR outputs a variety of gate control signals GCS, including a gate start pulse (GSP), a gate shift clock (GSC), a gate output enable signal (GOE), and the like, to control the gate driver GDR.

In addition, the controller CTR outputs a variety of data control signals DCS, including a source start pulse (SSP), a source sampling clock (SSC), a source output enable signal (SOE), and the like, to control the data driver DDR.

The controller CTR can be a timing controller used in a typical display device, or can be a control device including a timing controller and performing other control functions.

The controller CTR can be provided as a component separate from the data driver DDR, or can be provided as an integrated circuit (IC) combined (or integrated) with the data driver DDR.

The data driver DDR receives image data DATA from the controller CTR and supplies data voltages to the plurality of data lines DL to drive the plurality of data lines DL. The data driver DDR is also referred to as a source driver.

The data driver DDR can send and receive a variety of signals to and from the controller CTR via a variety of interfaces.

The gate driver GDR sequentially drives the plurality of gate lines GL by sequentially supplying a scanning signal to the plurality of gate lines GL. Herein, the gate driver GDR is also referred to as a scan driver.

The gate driver GDR sequentially supplies the scanning signal having an on or off voltage to the plurality of gate lines GL, under the control of the controller CTR.

If a specific gate line is opened by the gate driver GDR, the data driver DDR converts the image data DATA, received from the controller CTR, into analog data voltages, and supplies the data voltages to the plurality of data lines DL.

The data driver DDR can be disposed on one side of the panel PNL (e.g., above or below the panel PNL). In some situations, the data driver DDR can be disposed on both sides of the panel PNL (e.g., above and below the panel PNL), depending on the driving system, the design of the panel, or the like.

The gate driver GDR can be disposed on one side of the panel PNL (e.g., to the right or left of the panel PNL). In some situations, the gate driver GDR may be disposed on both sides of the panel PNL (e.g., to the right and left of the panel PNL), depending on the driving system, the design of the panel, or the like.

The data driver DDR can include one or more source driver ICs (SDICs).

Each of the source driver ICs can include a shift register, a latch circuit, a digital-to-analog converter (DAC), an output buffer, and the like. In some situations, the data driver DDR can further include one or more analog-to-digital converters (ADCs).

Each of the source driver ICs can be connected to a bonding pad of the panel PNL by tape-automated bonding (TAB) or by a chip-on-glass (COG) method, or can directly mounted on the panel PNL. In some situations, each of the source driver ICs can be integrated with the panel PNL. In addition, each of the source driver ICs can be implemented using a chip-on-film (COF) structure. In this situation, each of the source driver ICs can be mounted on a circuit film to be electrically connected to the data lines DL in the panel PNL via the circuit film.

The gate driver GDR can include a plurality of gate driver circuits (GDCs). Herein, the plurality of gate driver circuits can correspond to the plurality of gate lines GL, respectively.

Each of the gate driver circuits can include a shift register, a level register, and the like.

Each of the gate driver circuits can be connected to a bonding pad of the panel PNL by TAB or by a COG method. In addition, each of the gate driver circuits can be implemented using a COF structure. In this situation, each of the gate driver circuits can be mounted on a circuit film to be electrically connected to the gate lines GL in the panel PNL via the circuit film. In addition, each of the gate driver circuits can be implemented using gate-in-panel (GIP) structure disposed within the panel PNL. That is, each of the gate driver circuits may be directly provided in the panel PNL.

Figure 2:
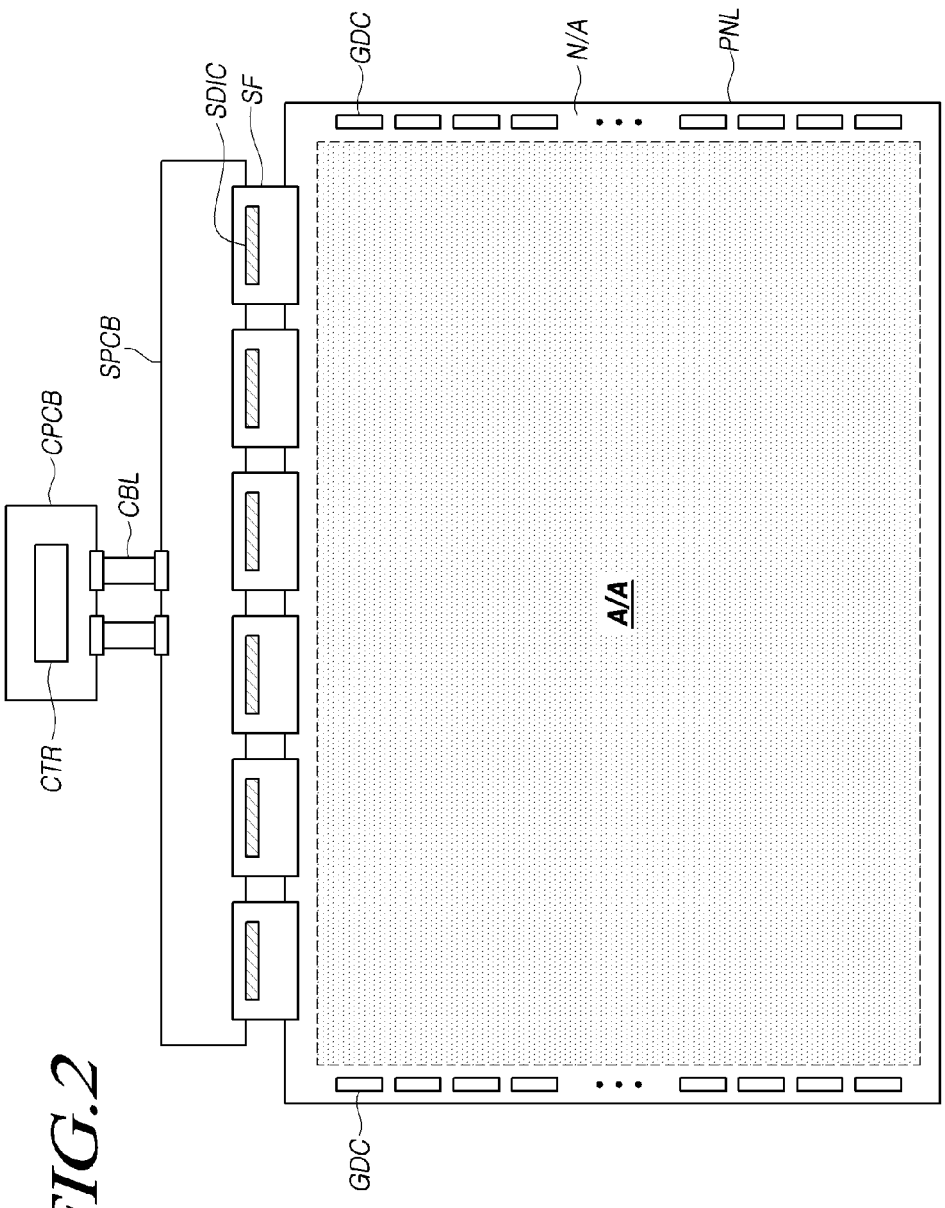
FIG. 2 illustrates a system of the electronic device according to embodiments.

FIG. 2 illustrates a system of the electronic device according to embodiments.

Referring to FIG. 2, in the electronic device according to embodiments, the data driver DDR can be implemented using a COF structure among a plurality of structures, such as a TAB structure, a COG structure, and a COF structure, while the gate driver GDR can be implemented using a GIP structure among a variety of structures, such as a TAB structure, a COG structure, a COF structure, and a GIP structure.

The data driver DDR can be comprised of one or more source driver ICs SDIC. In FIG. 2, the data driver DDR is illustrated as being comprised of a plurality source driver ICs SDIC.

In a situation in which the data driver DDR has the COF structure, each of the source driver ICs SDIC of the data driver DDR can be mounted on a corresponding one of source-side circuit films SF.

One portion of each of the source-side circuit films SF can be electrically connected to the pad assembly (e.g., the assembly of pads) present in the non-active area N/A of the panel PNL.

Lines, electrically connecting the source driver ICs SDIC and the panel PNL, can be disposed on the source-side circuit films SF.

The electronic device can include at least one source printed circuit board SPCB and a control printed circuit board CPCB, on which control components and a variety of electronic devices are mounted, in order to circuitry-connect the plurality of source driver ICs SDIC to the other devices.

The other portion of each of the source-side circuit films SF, on which the source driver IC SDICs are mounted, can be connected to the at least one source printed circuit board SPCB.

That is, one portion of each of the source-side circuit films SF, on which the source driver ICs SDIC are mounted, can be electrically connected to the non-active area N/A of the panel PNL, while the other portion of each of the source-side circuit films SF can be electrically connected to the source printed circuit board SPCB.

The controller CTR, controlling the operation of the data driver DDR, the gate driver GDR, and the like, can be disposed in the control printed circuit board CPCB.

In addition, a power management IC (PMIC) or the like can be disposed on the control printed circuit board CPCB. The power management IC supplies various forms of voltage or current to the panel PNL, the data driver DDR, the gate driver GDR, and the like, or controls various forms of voltage or current to be supplied to the same.

The source printed circuit board SPCB and the control printed circuit board CPCB can be circuitry-connected to each other via at least one connector CBL. The connector CBL can be, for example, a flexible printed circuit (FPC), a flexible flat cable (FFC), or the like.

The at least one source printed circuit board SPCB and the control printed circuit board CPCB can be integrated (or combined) into a single printed circuit board.

In a situation in which the gate driver GDR is implemented using a GIP structure, a plurality of gate driver circuits GDC of the gate driver GDR can be directly disposed in the non-active area N/A of the panel PNL.

Each of the plurality of gate driver circuits GDC can output a scanning signal SCAN to a corresponding gate line GL among the plurality of gate lines GL disposed in the active area A/A of the panel PNL.

The plurality of gate driver circuits GDC disposed on the panel PNL can be supplied with a variety of signals (e.g., a clock signal, a high-level gate voltage (VGH), a low-level gate voltage (VGL), a start signal (VST), a reset signal (RST), and the like), for the generation of the scanning signal, via the gate driving-related lines disposed in the non-active area N/A.

The gate driving-related lines disposed in the non-active area N/A can be electrically connected to certain source-side circuit films SF disposed closest to the plurality of gate driver circuits GDC.

Figure 3:
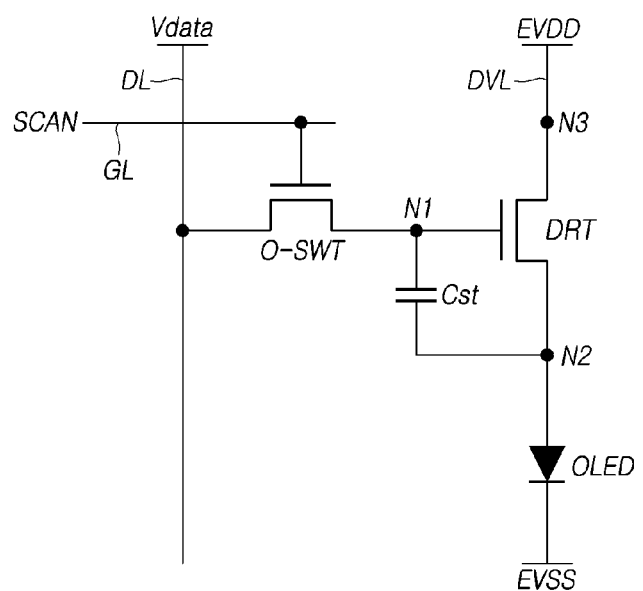
FIG. 3 illustrates a structure of a subpixel in the panel according to embodiments in a situation in which the panel is an organic light-emitting diode (OLED) panel.

FIG. 3 illustrates a structure of a subpixel SP in the panel PNL according to embodiments in a situation in which the panel PNL is an OLED panel.

Referring to FIG. 3, each of the subpixels SP in the OLED panel PNL can include an organic light-emitting diode OLED, a driving transistor DRT driving the organic light-emitting diode OLED, a switching transistor O-SWT electrically connected between a first node N1 of the driving transistor DRT and a corresponding data line DL, a storage capacitor Cst electrically connected to a first node and a second node N2 of the driving transistor DRT, and the like.

The organic light-emitting diode OLED can include an anode, an organic light-emitting layer, a cathode, and the like.

Referring to the circuit in FIG. 3, the anode (also referred to as a pixel electrode) of the organic light-emitting diode OLED can be electrically connected to the second node N2 of the driving transistor DRT. The cathode (also referred to as a common electrode) of the organic light-emitting diode OLED can have a base voltage EVSS applied thereto.

Herein, the base voltage EVSS can be, for example, a ground voltage or a voltage higher or lower than the ground voltage. In addition, the base voltage EVSS can vary, depending on the driving state. For example, the base voltage EVSS, during image driving, and the base voltage EVSS, during sensing driving, can be set differently.

The driving transistor DRT drives the organic light-emitting diode OLED by supplying a driving current to the organic light-emitting diode OLED.

The driving transistor DRT can include the first node N1, the second node N2, a third node N3, and the like.

The first node N1 of the driving transistor DRT can be a gate node, and can be electrically connected to a source node or a drain node of the switching transistor O-SWT. The second node N2 of the driving transistor DRT can be a source node or a drain node, and can be electrically connected to an anode (or a cathode) of the organic light-emitting diode OLED. The third node N3 of the driving transistor DRT can be a drain node or a source node, to which a driving voltage EVDD may be applied. The third node N3 can be electrically connected to a driving voltage line DVL, through which the driving voltage EVDD is supplied.

The storage capacitor Cst can be electrically connected between the first node N1 and the second node N2 of the driving transistor DRT to maintain a data voltage Vdata corresponding to an image signal voltage or a voltage corresponding to the data voltage Vdata during a single frame time (or a predetermined time).

The drain node or source node of the switching transistor O-SWT can be electrically connected to a corresponding data line DL. The source node or drain node of the switching transistor O-SWT can be electrically connected to the first node N1 of the driving transistor DRT. The gate node of the switching transistor O-SWT can be electrically connected to a corresponding gate line GL, through which a scanning signal SCAN is applied thereto.

The scanning signal SCAN can be applied to the gate node of the switching transistor O-SWT via the corresponding gate line GL, so that the switching transistor O-SWT is on-off controlled.

The switching transistor O-SWT can be turned on by the scanning signal SCAN to transfer the data voltage Vdata, supplied from the corresponding data line DL, to the first node N of the driving transistor DRT.

In addition, the storage capacitor Cst can be an external capacitor intentionally designed to be disposed externally of the driving transistor DRT, rather than a parasitic capacitor (e.g., Cgs or Cgd), e.g., an internal capacitor present between the first node N1 and the second node N2 of the driving transistor DRT.

Each of the driving transistor DRT and the switching transistor O-SWT can be an n-type transistor or a p-type transistor.

The subpixel structure illustrated in FIG. 3 has a two transistors and one capacitor (2T1C) structure. However, this is presented for illustrative purposes only, and in some situations, one or more transistors or one or more capacitors can further be included. In addition, the plurality of subpixels can have the same structure, or some subpixels among the plurality of subpixels can have a different structure from that of the remaining subpixels.

Figure 4:
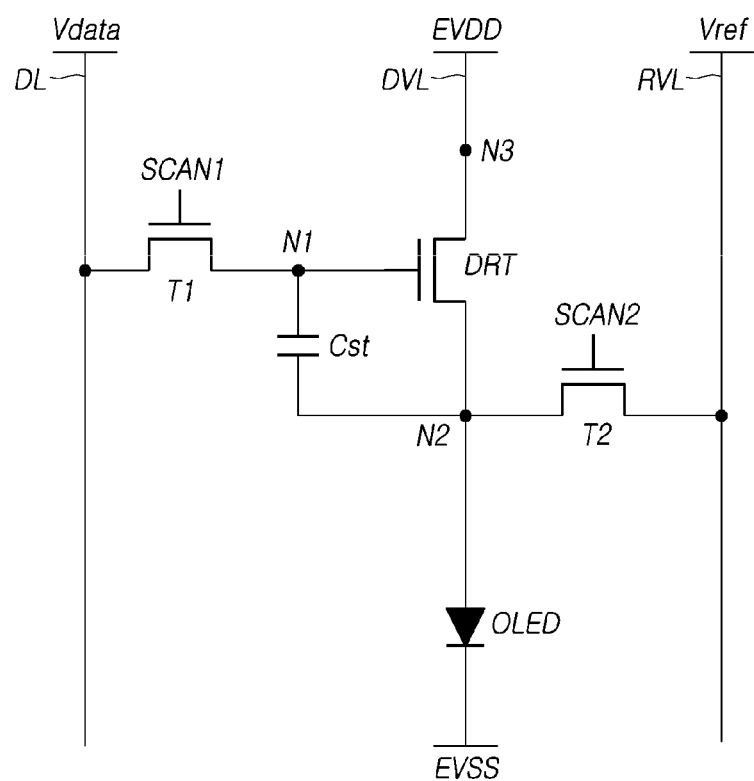
FIG. 4 illustrates a three transistors and one capacitor (3T1C) structure of a single subpixel further including a second transistor electrically connected between the second node of the driving transistor and the reference voltage line according to an embodiment.

FIG. 4 illustrates a three transistors and one capacitor (3T1C) structure of a subpixel SP. The 3T1C structure further includes a second transistor T2 electrically connected to the second node N2 of the driving transistor DRT and a reference voltage line RVL.

Referring to FIG. 4, the second transistor T2 can be electrically connected between the second node N2 of the driving transistor DRT and the reference voltage line RVL. A second scanning signal SCAN2 can be applied to a gate node of the second transistor T2 to on-off control the second transistor T2.

A drain node or a source node of the second transistor T2 can be electrically connected to the reference voltage line RVL, and the source node or the drain node of the second transistor T2 can be electrically connected to the second node N2 of the driving transistor DRT.

For example, the second transistor T2 can be turned on in a period during display driving, and can be turned off in a period during sensing driving in which characteristics of the driving transistor DRT or characteristics of the organic light-emitting diode OLED are sensed.

The second transistor T2 can be turned on by the second scanning signal SCAN2 at a corresponding driving time (e.g., a display driving time or an initialization time in the period during sensing driving) to transfer a reference voltage Vref, supplied to the reference voltage line RVL, to the second node N2 of the driving transistor DRT.

In addition, the second transistor T2 can be turned on by the second scanning signal SCAN2 at a corresponding driving time (e.g., a sampling time in the period during sensing driving) to transfer a voltage of the second node N2 of the driving transistor DRT to the reference voltage line RVL.

In other words, the second transistor T2 can control the voltage state of the second node N2 of the driving transistor DRT or transfer a voltage of the second node N2 of the driving transistor DRT to the reference voltage line RVL.

The reference voltage line RVL can be electrically connected to the analog-to-digital converter (ADC) sensing and converting the voltage of the reference voltage line RVL to a digital value and outputting sensing data including the digital value.

The analog-to-digital converter can be included in the source driver ICs SDIC of the data driver DDR.

Detection data, output by the analog-to-digital converter, can be used to sense characteristics (e.g., a threshold voltage or mobility) of the driving transistor DRT or characteristics (e.g., a threshold voltage) of the organic light-emitting diode OLED.

In addition, the storage capacitor Cst can be an external capacitor intentionally designed to be disposed externally of the driving transistor DRT, rather than a parasitic capacitor (e.g., Cgs or Cgd), e.g., an internal capacitor present between the first node N1 and the second node N2 of the driving transistor DRT.

Each of the driving transistor DRT, a first transistor T1, and the second transistor T2 can be an n-type transistor or a p-type transistor.

In addition, a first scanning signal SCAN1 and the second scanning signal SCAN2 can be separate gate signals. In this situation, the first scanning signal SCAN1 and the second scanning signal SCAN2 can be applied to a gate node of the first transistor T1 and a gate node of the second transistor T2 through different gate lines, respectively.

In some situations, the first scanning signal SCAN1 and the second scanning signal SCAN2 can be the same gate signal. In this situation, the first scanning signal SCAN1 and the second scanning signal SCAN2 can be commonly applied to the gate node of the first transistor T1 and the gate node of the second transistor T2 through the same gate line.

The subpixel structures illustrated in FIGS. 3 and 4 are presented for illustrative purposes only, and in some situations, one or more transistors or one or more capacitors can further be included.

In addition, the plurality of subpixels can have the same structure, or some subpixels among the plurality of subpixels can have a different structure from the remaining subpixels.

Figure 5:
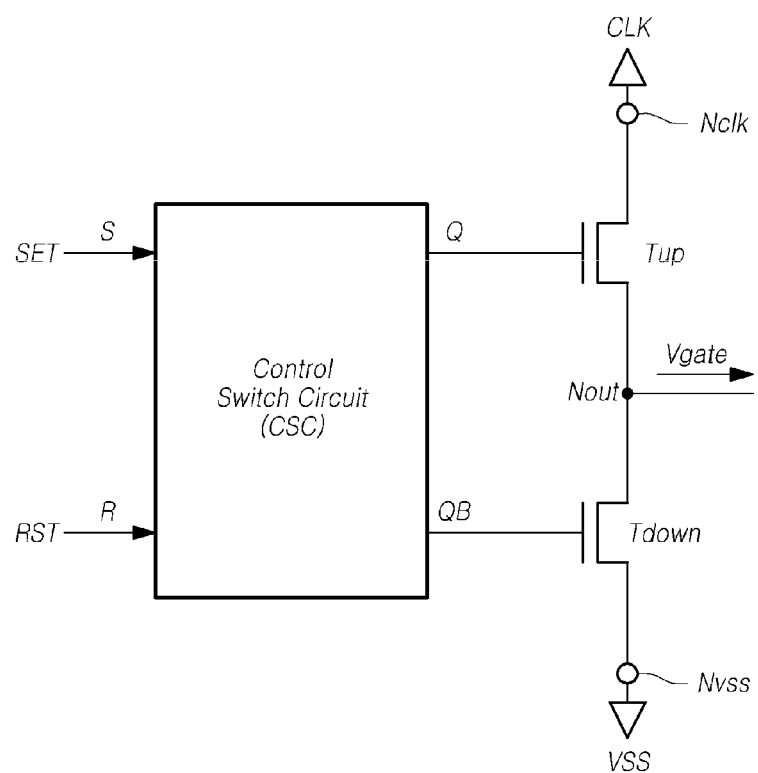
FIG. 5 schematically illustrates a gate driver circuit disposed in the panel according to embodiments.

FIG. 5 schematically illustrates a gate driver circuit GDC disposed in the panel PNL according to embodiments.

Referring to FIG. 5, each of the gate driver circuits GDC can include a pull-up transistor Tup, a pull-down transistor Tdown, a control switch circuit CSC, and the like.

The control switch circuit CSC is a circuit controlling a voltage of a node Q, corresponding to a gate node of the pull-up transistor Tup and a voltage of a node QB corresponding to a gate node of the pull-down transistor Tdown. The control switch circuit CSC can include a plurality of switches (transistors).

The pull-up transistor Tup is a transistor supplying a gate signal Vgate, corresponding to a first level voltage (e.g., a high-level voltage (VGH)), to the gate line GL through a gate signal output node Nout. The pull-down transistor Tdown is a transistor supplying a gate signal Vgate, corresponding to a second level voltage (e.g., a low-level voltage (VGL)), to the gate line GL through the gate signal output node Nout. The pull-up transistor Tup and the pull-down transistor Tdown can be turned on at different points in time.

The pull-up transistor Tup is electrically connected between a clock signal application node Nclk, to which a clock signal CLK is applied, and the gate signal output node Nout electrically connected to the gate line GL. The pull-up transistor Tup is turned on or off by the voltage of the node Q.

The gate node of the pull-up transistor Tup is electrically connected to the node Q. A drain node or a source node of the pull-up transistor Tup is electrically connected to the clock signal application node Nclk. The source node or the drain node of the pull-up transistor Tup is electrically connected to the gate signal output node Nout, from which the gate signal Vgate is output.

The pull-up transistor Tup is turned on by the voltage of the node Q to output the gate signal, having a high-voltage level VGH in a high-level range of the clock signal CLK, to the gate signal output node Nout.

The gate signal Vgate of the high-level voltage VGH, output to the gate signal output node Nout, is supplied to the corresponding gate line GL.

The pull-down transistor Tdown is electrically connected between the gate signal output node Nout and a base voltage node Nvss, and is turned on or off by the voltage of the node QB.

The gate node of the pull-down transistor Tdown is electrically connected to the node QB. A drain node or a source node of the pull-down transistor Tdown is electrically connected to the base voltage node Nvss to receive a base voltage VSS, corresponding to a positive voltage, applied thereto. The source node or the drain node of the pull-down transistor Tdown is electrically connected to the gate signal output node Nout, from which the gate signal Vgate is output.

The pull-down transistor Tdown is turned on by the voltage of the node QB to output the gate signal Vgate having a low-level voltage (VGL) to the gate signal output node Nout. Accordingly, the gate signal Vgate having the low-level voltage (VGL) can be supplied to the corresponding gate line GL through the gate signal output node Nout. Herein, the gate signal Vgate having the low-level voltage (VGL) can be, for example, a base voltage VSS.

In addition, the control switch circuit CSC can be comprised of two or more transistors, and can include major nodes, such as the node Q, the node QB, a set node (also referred to as a "start node") S, and a reset node R. In some situations, the control switch circuit CSC can further include an input node, to which a variety of voltages, such as a driving voltage (VDD), is input.

In the control switch circuit CSC, the node Q is electrically connected to the gate node of the pull-up transistor Tup, and is repeatedly charged and discharged.

In the control switch circuit CSC, the node QB is electrically connected to the gate node of the pull-down transistor Tdown, and is repeatedly charged and discharged.

In the control switch circuit CSC, the set node S has a set signal SET applied thereto, the set signal SET indicating the start of gate driving of the corresponding gate driver circuit GDC.

Herein, the set signal SET applied to the set node S can be a start signal (VST) input from outside of the gate driver GDR, or may be a signal (e.g., a carry signal), to which a gate signal Vgate, output by a gate driver circuit GDC in a previous stage, preceding the current gate driver circuit GDC, is feedbacked.

The reset signal RST, applied to the reset node R of the control switch circuit CSC, can be a reset signal, by which the gate driver circuits GDC of all stages are simultaneously initialized, or can be a carry signal input from another stage (e.g., a previous or subsequent stage).

The control switch circuit CSC charges the node Q in response to the set signal SET, and discharges the node Q in response to the reset signal RST. The control switch circuit CSC can include an inverter circuit to charge or discharge the node Q and the node QB at different points in time.

As illustrated in FIG. 3, the driving transistor DRT and the switching transistor O-SWT can be disposed in each subpixel SP among the plurality of subpixels SP in the active area A/A of the panel PNL implemented as an OLED panel. However, embodiments are not limited thereto, and as illustrated in FIG. 4, three or more transistors may be disposed in the active area A/A of the OLED panel PNL.

In addition, as illustrated in FIG. 2, the gate driver circuit GDC can be implemented using an INS1P structure, e.g., the gate driver circuit GDC can be disposed within the panel PNL. In this situation, a variety of transistors of the gate driver circuit GDC, such as the pull-up transistor Tup, the pull-down transistor Tdown, and other transistors within the control switch circuit CSC, as illustrated in FIG. 5, can be disposed in the non-active area N/A, located in the periphery of the active area A/A of the panel PNL.

In addition, in the transistors disposed in the active area A/A and/or the non-active area N/A of the panel PNL, the device performance (e.g., mobility or on-current characteristic) thereof can be determined by the channel length and S-factor (SS, sub-threshold swing). Therefore, the structure of a transistor, among the transistors, having a short channel and a transistor, among the transistors, having a high S-factor, intended to improve device performance, will be described hereinafter.

According to embodiments, the electronic device can include a panel and a driver circuit driving the panel. First and second transistors disposed in the panel can include: a first electrode of the first transistor, the first electrode being disposed on a substrate; a first insulating film disposed on the substrate, overlapping one end of the first electrode, and having at least one open area; a second electrode of the first transistor, the second electrode being disposed on the first insulating film to overlap a portion of the first electrode; a third electrode and a fourth electrode of the second transistor, the third electrode and the fourth electrode being disposed on the same layer as the second electrode to be spaced apart from the second electrode, with the open area of the first insulating film being disposed between the third electrode and the fourth electrode; a first active layer of the first transistor, the first active layer being disposed on the first electrode, the first insulating film, and the second electrode; a second active layer of the second transistor, the second active layer being disposed on the third electrode and the fourth electrode, along the open area of the first insulating film; a second insulating film disposed on the first active layer, the second active layer, and the third electrode; and a first gate electrode of the first transistor and a second gate electrode of the second transistor, the first gate electrode being disposed on the second insulating film and overlapping the first active layer, and the second gate electrode being disposed on the second insulating film and overlapping the second active layer.

The structure of the transistor, as briefly described above, will be described in more detail with reference to the accompanying drawings.

Figure 6:
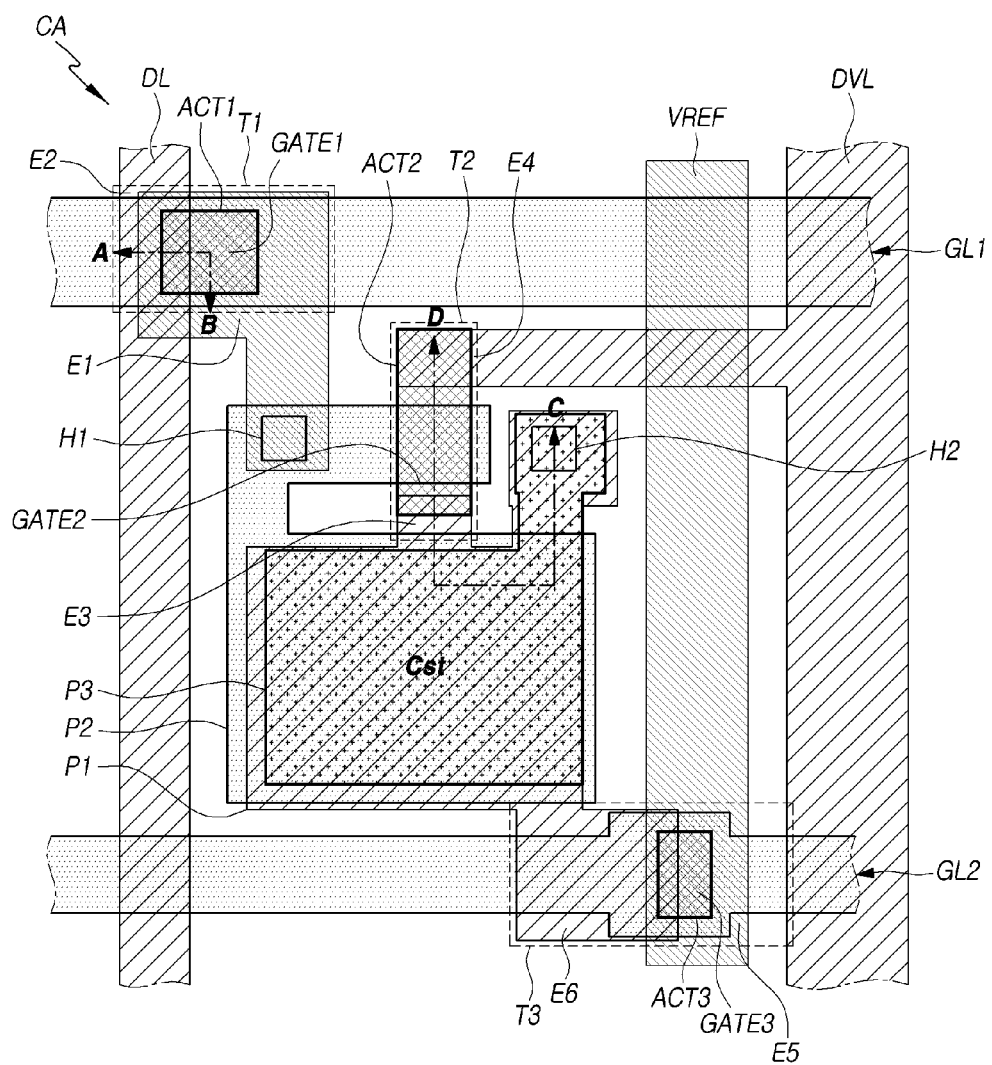
FIG. 6 illustrates a circuit area in which transistors according to an embodiment are disposed.

FIG. 6 illustrates a circuit area CA in which transistors according to an embodiment are disposed.

The circuit area CA illustrated in FIG. 6 can be included in at least one subpixel SP among the plurality of subpixels disposed in the panel PNL.

Referring to FIG. 6, the circuit area CA included in a single subpixel SP can include three transistors and one storage capacitor Cst.

However, embodiments are not limited thereto, and the circuit area CA in a single subpixel SP can include at least two transistors and one storage capacitor Cst.

Specifically, referring to FIG. 6, the circuit area CA can include three transistors T1, T2, and T3 and one storage capacitor Cst.

The first transistor T1 can include a first electrode E1, a first active layer ACT1, a second electrode E2, and a first gate electrode GATE1.

The second transistor T2 can include a third electrode E3, a second active layer ACT2, a fourth electrode E4, and a second gate electrode GATE2.

The third transistor T3 can include a fifth electrode E5, a third active layer ACT3, a sixth electrode E6 (e.g., E6 can be electrically connected to E3), and a third gate electrode GATE3.

In addition, a data line DL extending in a single direction, as well as a driving voltage line DVL and a reference voltage line VREF parallel to the data line DL, can be disposed in the single subpixel SP.

In addition, at least one gate line (or a scan line) GL can be disposed to intersect the data line DL, the driving voltage line DVL, and the reference voltage line VREF.

In the present embodiment, the following description will mainly be focused on a configuration in which two gate lines GL intersect the data line DL, the driving voltage line DVL, and the reference voltage line VREF in the single subpixel SP.

As illustrated in FIG. 6, a first gate line GL and a second gate line GL2 spaced apart from each other can be disposed in the single subpixel SP.

In addition, the first electrode E1 of the first transistor T1 can be present on the same layer as the reference voltage line VREF while being spaced apart from the reference voltage line VREF.

The first electrode E1, the first active layer ACT1, the data line DL, and the first gate line GL1 can overlap each other. Here, the data line DL can serve as the second electrode E2 of the first transistor T1. The first gate line GL1 can serve as the first gate electrode GATE1 of the first transistor T1.

One of the first electrode E1 and the second electrode E2 can be a source electrode of the first transistor T1, while the other of the first electrode E1 and the second electrode E2 can be a drain electrode of the first transistor T1.

That is, in the first transistor T1, it is not necessary to branch the source electrode or the drain electrode from the data line DL, since the data line DL serves as the source electrode or the drain electrode. In addition, it is not necessary to branch the configuration of the first gate electrode GATE1 from the first gate line GL, since the first gate line GL serves as the gate electrode of the first transistor T1.

Accordingly, an area that would otherwise be occupied by the configuration of the source or drain electrode branched from the data line DL and an area that would otherwise be occupied by the configuration of the first gate electrode branched from the first gate line GL1 can be reduced, thereby reducing the size of the circuit area CA.

In addition, the fourth electrode E4 of the second transistor T2, branched from the driving voltage line DVL, can be disposed in the circuit area CA. In addition, the third electrode E3 of the second transistor T2 can be disposed on the same layer as the fourth electrode E4 while being spaced apart from the fourth electrode E4.

The second active layer ACT2 can be disposed to overlap the third electrode E3 and the fourth electrode E4. A portion of the second active layer ACT2 can overlap the second gate electrode GATE2.

Here, one of the third electrode E3 and the fourth electrode E4 can be a source electrode of the second transistor T2, while the other of the third electrode E3 and the fourth electrode E4 can be a drain electrode of the second transistor T2.

In addition, the third electrode E3 can be provided integrally with a first plate P1, while the second gate electrode GATE2 can be provided integrally with a second plate P2.

The first plate P1 and the second plate P2 can overlap each other. A third plate P3 can be disposed to overlap the first plate P1 and the second plate P2. An insulating film can be disposed between the first plate P1 and the second plate P2, and an insulating film can be disposed between the second plate P2 and the third plate P3.

Due to this structure, the first to third plates P1, P2, and P3 can generate dual storage capacitors Cst.

The first plate P1 can be provided integrally with the sixth electrode E6 of the third transistor T3.

The sixth electrode E6 of the third transistor T3 can overlap the third active layer ACT3, the reference voltage line VREF, and the second gate line GL2. In other words, the sixth electrode E6, the third active layer ACT3, the reference voltage line VREF, and the second gate line GL2 can overlap one another.

Here, the reference voltage line VREF can serve as the fifth electrode E5 of the third transistor T3. The second gate line GL2 can serve as the third gate electrode GATE3 of the third transistor T3.

One of the fifth electrode E5 and the sixth electrode E6 can be a source electrode of the third transistor T3, while the other of the fifth electrode E5 and the sixth electrode E6 can be a drain electrode of the third transistor T3.

That is, in the third transistor T3, it is not necessary to branch the source electrode or the drain electrode from the reference voltage line VREF, since the reference voltage line VREF serves as the source or drain electrode. In addition, it is not necessary to branch the configuration of the third gate electrode GATE3 from the second gate line GL2, since the second gate line GL2 serves as the gate electrode of the third transistor T3.

Accordingly, an area that would otherwise be occupied by the configuration of the source or drain electrode branched from the reference voltage line VREF and an area that would otherwise be occupied by the configuration of the third gate electrode GATE3 branched from the second gate line GL2 can be reduced, thereby reducing the size of the circuit area CA.

According to an embodiment, the first electrode E1 of the first transistor T1 can be electrically connected to the second gate electrode GATE2 of the second transistor T2 and the storage capacitor Cst. However, the present disclosure is not limited thereto, and the second electrode E2 of the first transistor T1 may be electrically connected to the second gate electrode GATE2 and the storage capacitor Cst.

A data voltage can be applied to the second transistor T2.

In addition, the fifth electrode E5 of the third transistor T3 can be electrically connected to the third electrode E3 or the fourth electrode E4 of the second transistor T2. However, the present disclosure is not limited thereto, and the sixth electrode E6 of the third transistor T3 can be electrically connected to the third electrode E3 or the fourth electrode E4 of the second transistor T2. The transistor having the above-described structure will be described hereinafter with reference to FIG. 7.

Figure 7:
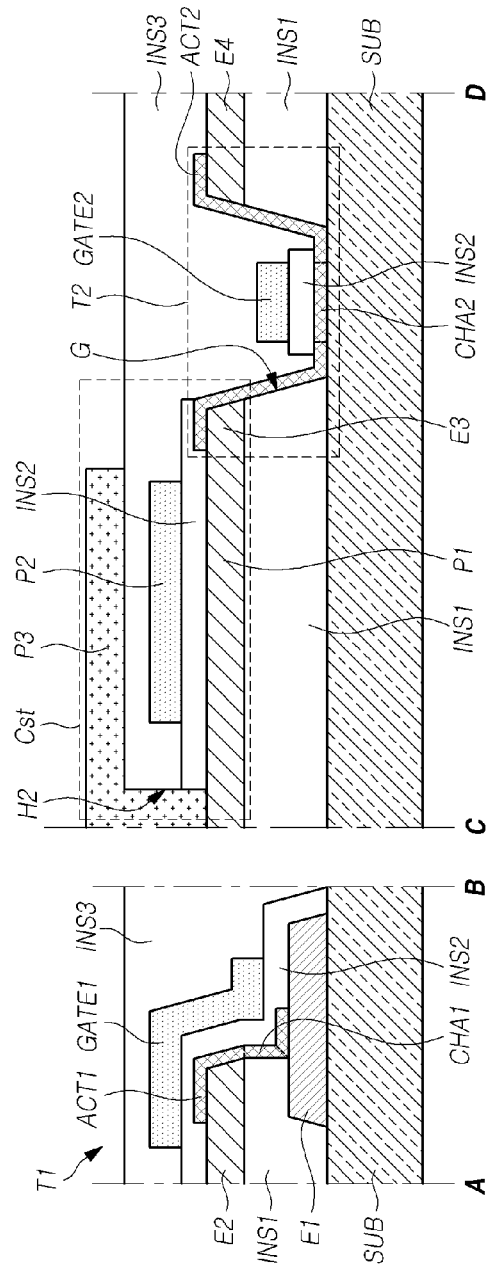
FIG. 7 is a cross-sectional view taken along line A-B and line C-D in FIG. 6 according to an embodiment.

FIG. 7 is a cross-sectional view taken along line A-B and line C-D in FIG. 6.

Referring to FIG. 7, the first transistor T1 includes the first electrode E1, the second electrode E2, the first active layer ACT1, and the first gate electrode GATE1.

The storage capacitor Cst includes the first plate P1, the second plate P2, and the third plate P3.

The second transistor T2 includes the third electrode E3, the fourth electrode E4, the second active layer ACT2, and the second gate electrode GATE2.

Although not shown in FIG. 7, as illustrated in FIG. 6, the third transistor T3 includes the fifth electrode E5, the sixth electrode E6, the third active layer ACT3, and the third gate electrode GATE3. The cross-sectional structure of the third transistor T3 can be the same as the cross-sectional structure of the first transistor T1 illustrated FIG. 7.

Thus, descriptions of the cross-sectional structure of the third transistor T3 will be omitted for the sake of brevity.

Specifically, the structures of the first transistor T1, the second transistor T2, and the storage capacitor Cst will be described as follows.

The first electrode E1 is disposed on a substrate SUB.

A first insulating film INS1 can be disposed on the substrate SUB to overlap one end of the first electrode E1. In other words, the first insulating film INS1 can be disposed to expose a portion of the first electrode E1.

The first insulating film INS1 can be disposed on the entirety of the active area A/A of the panel PNL, and have at least one open area. In addition, in some situations, the first insulating film INS1 can extend to be disposed on the non-active area N/A, in the periphery of the active area A/A.

The second electrode E2 of the first transistor T1 is disposed on the first insulating film INS1. A portion of the second electrode E2 can overlap a portion of the first electrode E1.

In addition, the third electrode E3 and the fourth electrode E4 of the second transistor T2 are disposed on the first insulating film INS1 to be spaced apart from the second electrode E2, with an open area or recess G of the first insulating film INS1 being disposed therebetween.

The first active layer ACT1 of the first transistor T1 is disposed on the first electrode E1, the first insulating film INS1, and the second electrode E2.

Specifically, the first active layer ACT1 may include an area disposed on a portion of the top surface of the first electrode E1, an area extending from the area disposed on the portion of the top surface of the first electrode E1 to be disposed on a side surface of the first insulating film INS1, and an area extending from the area disposed on the side surface of the first insulating film INS1 to be disposed on a portion of the second electrode E2.

The first active layer ACT1 can include a first channel area CHA1. The first channel area CHA1 can be a remaining area of the first active layer ACT1, except for areas of the first active layer ACT1 in contact with the first electrode E1 and the second electrode E2. In other words, the first channel area CHA1 can be an area of the first active layer ACT1 in contact with the side surface of the first insulating film INS1.

Accordingly, the maximum length of the first channel area CHA1 can be the length of an area in which the first active layer ACT1 is in contact with the first insulating film INS1 (e.g., the length of the first channel area CHA1 can be equal to or approximately equal to or based on a height of the outer side surface of the first insulating film INS1).

Since the length of the first channel area CHA1 includes the length of the first active layer ACT1 in the area overlapping the side surface of the first insulating film INS1, a change in the height of the first insulating film INS1 can also cause a change in the length of the first channel area CHA1. That is, the length of the first channel area CHA1 can be proportional to the height of the first insulating film INS1.

For example, when the height of an insulation pattern is lowered, the length of the active layer, in the area in contact with one side surface of the insulation pattern, can be reduced, thereby reducing the entire length of the channel area.

The second active layer ACT2 of the second transistor T2 can be disposed on the third electrode E3 and the fourth electrode E4 of the second transistor T2, along the open area or recess G of the first insulating film INS1 (e.g., the open area or recess G can correspond to a ditch or hole in the first insulating film INS1 for receiving the second transistor T2).

Specifically, the second active layer ACT2 includes an area overlapping the third electrode E3, an area extending from the area overlapping the third electrode E3 to be disposed in the open area or recess G of the first insulating film INS1, and an area extending from the area disposed in the open area or recess G of the first insulating film INS1 to overlap the fourth electrode E4.

In addition, the third electrode E3 of the second transistor T2 can be provided integrally with the first plate P1 of the storage capacitor Cst. That is, the first plate P1 of the storage capacitor Cst can be disposed on the same layer as the second electrode E2 of the first transistor T1 and the third and fourth electrodes E3 and E4 of the second transistor T2.

A second insulating film INS2 can be disposed on the first active layer ACT1, the second active layer ACT2, and the first plate P1. Here, the second insulating film INS2 can be a gate insulating film.

In addition, the first gate electrode GATE1, the second gate electrode GATE2, and the second plate P2 can be disposed on the second insulating film INS2. The second gate electrode GATE2 is disposed closer to the substrate SUB than the third and fourth electrodes E3, E4 of the second transistor T2.

Specifically, the first gate electrode GATE1 of the first transistor T1 can be disposed on the second insulating film INS2 to overlap the first active layer ACT1.

The second gate electrode GATE2 of the second transistor T2 can be disposed on the second insulating film INS2 to overlap the second active layer ACT2.

The second active layer ACT2 can include a second channel area CHA2. The second channel area CHA2 can be an area overlapping the second gate electrode GATE2. Accordingly, the length of the second channel area CHA2 can be the length of an area in which the second active layer ACT2 overlaps the second gate electrode GATE2. The second active layer ACT2 includes the conducted area, the conducted area non-overlapping with the second gate electrode GATE2. The conducted area of the second active layer ACT2 includes at least one sloped area. The sloped area includes a region corresponding to one side of the third and fourth electrodes E3, E4 of the second transistor T2.

In addition, the second plate P2, overlapping the first plate P1, can be disposed on the second insulating film INS2. The second plate P2 can be disposed on the same layer as the first gate electrode GATE1 and the second gate electrode GATE2, and be made of the same material as the first gate electrode GATE1 and the second gate electrode GATE2.

A third insulating film INS3 can be disposed on the substrate SUB on which the first gate electrode GATE1, the second gate electrode GATE2, and the second plate P2 are disposed.

The third plate P3 can be disposed on the third insulating film INS3. The third plate P3 can be electrically connected to the first plate P1 via a second hole H2 provided in the second insulating film INS2 and the third insulating film INS3.

As described above, the first transistor T1 and the second transistor T2 can have different structures.

Specifically, in first transistor T1, the first electrode E1 and the second electrode E2, respectively serving as the source electrode or the drain electrode, are disposed on different layers. In addition, the first channel area CHA1 of the first active layer ACT1 can be disposed in a direction non-parallel to the substrate SUB (e.g., the first channel area CHA1 can be disposed parallel to or approximately parallel to the side surface of the first insulating film INS1). The expression "direction non-parallel to the substrate SUB" can comprehensively include any situations in which an angle between the first channel area CHA1 and the substrate SUB is greater than 0° and smaller than 180° (e.g., the first channel area CHA1 can be arranged vertical or perpendicular to the substrate SUB, or diagonal to the substrate SUB).

In contrast, in the second transistor T2, the third electrode E3 and the fourth electrode E4, respectively serving as the source electrode or the drain electrode, are disposed on the same layer. In addition, the second channel area CHA2 of the second active layer ACT2 can be disposed to be parallel to the substrate SUB.

In addition, the size of the subpixels SP present in the active area A/A should be reduced to fabricate a high-resolution panel.

As a method of reducing the size of the subpixels SP, a method of reducing the length of the channel area of each of the transistors disposed in the subpixels. However, it may be difficult to sufficiently reduce the length of the channel area, due to the limited ability of exposure equipment.

In addition, even in the situation that the active layer having a short channel is formed using exposure equipment, the channel areas of the transistors, fabricated in the panel PNL, have non-uniform lengths. The lengths of the channel areas may vary depending on the transistor.

In contrast, according to an embodiment, the length of the first channel area CHA1 of the first transistor T1 can be proportional to the height of the first insulating film INS1 (e.g., sizing of the first channel area CHA1 in the first transistor T1 having a vertical type structure can be more accurately controlled).

In other words, in the transistor according to the present disclosure, it is possible to adjust the length of the channel area by merely adjusting the height of the insulation pattern, instead of determining the length of the channel area of the active layer by exposure processing or the like.

Although the height of the first insulating film INS1 according to an embodiment can range from 100 nm to 500 nm, the present disclosure is not limited thereto.

In addition, according to an embodiment, the third active layer ACT3 having the short channel area can be realized by disposing not only the first channel area CHA1 of the first transistor T1, but also a third channel area of the third transistor T3, to be non-parallel to the substrate SUB.

The area of the first transistor T can be reduced as described above, thereby facilitating the fabrication of high-resolution panels.

In addition, the second transistor T2 according to the present disclosure can be a driving transistor.

It is desirable that the driving transistor have a high S-factor. The S-factor can be represented using a sub-threshold graph, e.g., an S-factor graph.

The S-factor graph is a graph representing the ratio of the variation of gate voltage to the variation of driving current. A relatively-high inclination of the S-factor graph of the driving transistor may lead to a narrow range of available data voltages, which is disadvantageous for low-gradation expression. In this situation, a conversion rate of the transistor from an off state to an on state may be low.

Here, the inclination of the S-factor graph can be 1/S-factor.

In other words, the S-factor indicates how fast channel potential changes in response to a change in the gate voltage. A high S-factor means a relatively-slow change in channel potential, compared to the situation of a low S-factor.

The S-factor is reversely proportional to the width to length ratio of the channel area of the driving transistor. According to the present disclosure, the second transistor T2 can be fabricated such that the length of the second channel area CHA2 thereof corresponds to the length of the second gate electrode GATE2. Accordingly, the length of the second channel area CHA2 can be prevented from being excessively reduced, so that the S-factor is not reduced by the excessively reduced length of the second channel area CHA2.

That is, since the length of the second channel area CHA2 of the second transistor T2 according to an embodiment is appropriate for the driving transistor, a high S-factor can be obtained, and the effect of increasing the range of available data voltages can be obtained.

In addition, as illustrated in FIG. 7, the first transistor T1 according to the present disclosure is configured such that the first active layer ACT1 directly contacts the first electrode E1 and the second electrode E2. The second transistor T2 is also configured such that the second active layer ACT2 directly contacts the third electrode E3 and the fourth electrode E4.

In addition, a typical transistor is configured such that an insulating film is disposed between an active layer, a source electrode, and a drain electrode, and the source electrode and the drain electrodes are brought into contact with the active layer via contact holes formed in the insulating film. In this situation, the areas of the source electrode and the drain electrode may inevitably be increased by areas corresponding to the widths of the entrances of the contact holes formed in the gate insulating film.

In contrast, according to the present disclosure, the effect of reducing the device area can be obtained, due to the structure in which the first active layer ACT1 directly contacts the first and second electrodes E1 and E2, and the second active layer ACT2 directly contacts the third and fourth electrodes E3 and E4.

That is, the transistor according to embodiments can have a smaller area while obtaining superior electrical properties.

Although the foregoing description has been focused on the configuration in which the first to third transistors T1, T2, and T3 are disposed in the subpixels SP in the active area A/A of the panel PNL, the present disclosure is not limited thereto.

For example, at least one transistor among the first, second, or third transistor T1, T2, or T3 can be present in the non-active area N/A located in the periphery of the active area A/A.

This structure will be described hereinafter with reference to FIG. 8.

Figure 8:
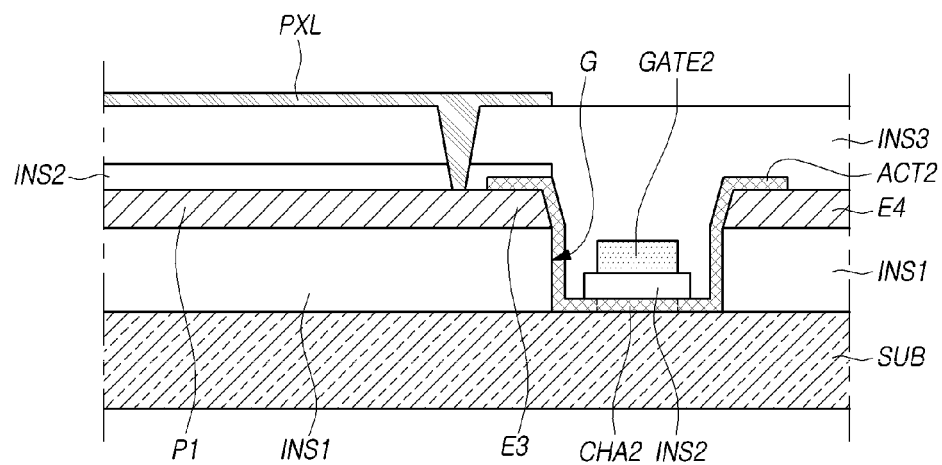
FIG. 8 illustrates a structure connecting a transistor to a pixel electrode according to embodiments, disposed in a subpixel.

FIG. 8 illustrates a structure connecting transistors according to embodiments, disposed in a subpixel SP, to pixel electrodes.

Referring to FIG. 8, among the transistors having a vertical structure disposed in the subpixels SP in the active area A/A, there can be a transistor, an electrode of which is electrically connected to a pixel electrode PXL.

Referring to FIG. 8, according to the present disclosure, the third electrode E3 of the second transistor T2 can be connected to the pixel electrode PXL.

The pixel electrode PXL can be electrically connected to the third electrode E3 of the second transistor T2 via the second hole H2 formed in the second insulating film INS2 and the third insulating film INS3.

The transistors as described above can be fabricated as described below.

FIGS. 9 to 16 illustrate operations of fabricating transistors according to an embodiment.

The following description will mainly be focused on the fabrication of the first transistor T1 and the second transistor T2, for the sake of brevity. The third transistor T3 can be fabricated by the same processing and the same operation as those used for the first transistor T1.

Figure 9:
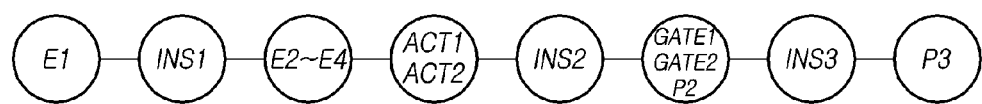
FIGS. 9 to 16 illustrate operations of fabricating transistors according to an embodiment.

First, referring to FIG. 9, the fabrication can be performed in the order of the first electrode E1, the first insulating film INS1, the second, third and fourth electrodes (E2, E3, and E4), the first and second active layers (ACT1 and ACT2), the second insulating film INS2, the first and second gate electrodes (GATE1 and GATE2) together with the second plate P2, the third insulating film INS3, and the third plate P3. Also, the third active layer ACT3 can be formed in the same process as the first and second active layers ACT1 and ACT2, and the third gate electrode GATE3 can be formed in the same process as the first and second gate electrodes GATE1 and GATE2 (e.g., as discussed above, since the third transistor T3 can be fabricated by the same processing and the same operation as those used for the first transistor T1, its corresponding steps will not be described as much detail as T1 and T2 for the sake of brevity).

Figure 10:
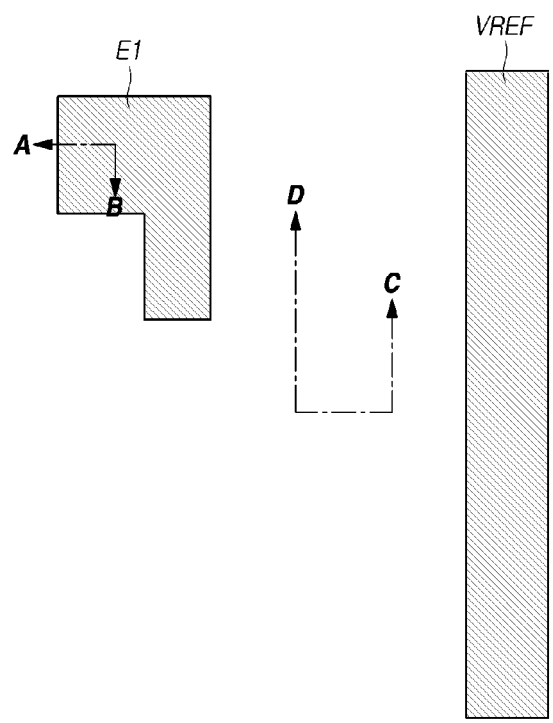
Figure 10:
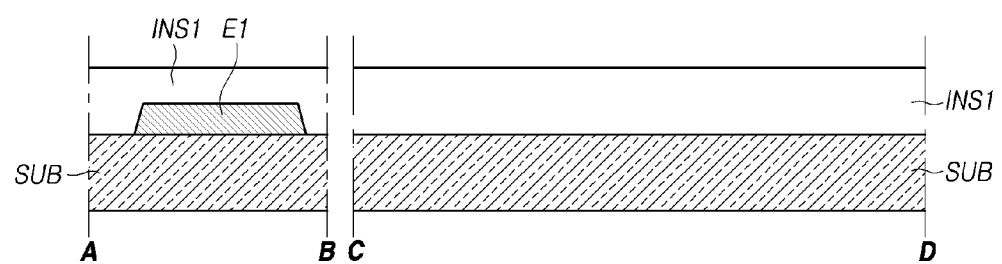

Specifically, referring to FIG. 10, the first electrode E1 of the first transistor T1, and the reference voltage line VREF, are fabricated on the substrate SUB. The reference voltage line VREF can be the fifth electrode E5 of the third transistor T3.

Figure 11:
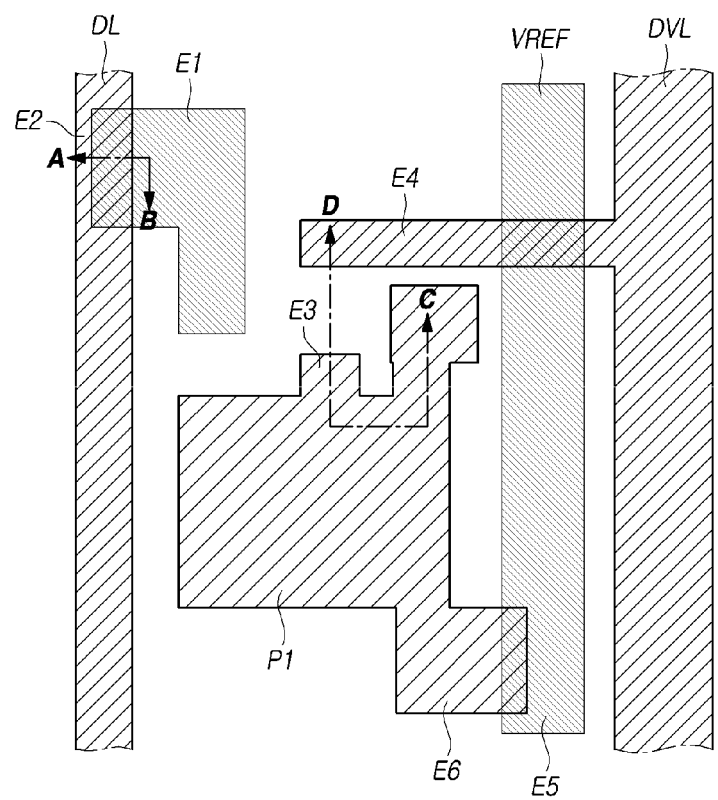
Figure 11:
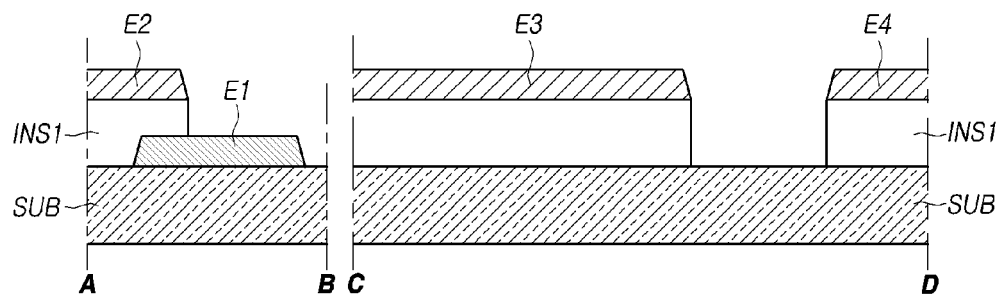

Afterwards, as illustrated in FIG. 11, the first insulating film INS1 is fabricated on the substrate SUB on which the first electrode E1 and the reference voltage line VREF are fabricated. The first insulating film INS1 can be fabricated by a typical deposition method. For example, the first insulating film INS1 can be fabricated by plasma enhanced chemical vapor deposition (PECVD), sputtering, or the like.

The first insulating film INS1 exposes a portion of the first electrode E1, and has at least one open area or recess G.

The data line DL, the driving voltage line DVL, and the first plate P1 are fabricated on the substrate SUB on which the first insulating film INS1 is disposed.

Here, the data line DL can be the second electrode E2 of the first transistor T1, while the first plate P1 can be the third electrode E3 of the second transistor T2 and the sixth electrode E6 of the third transistor T3. In addition, an area branched from the driving voltage line DVL can be the fourth electrode E4 of the second transistor T2.

Figure 12:
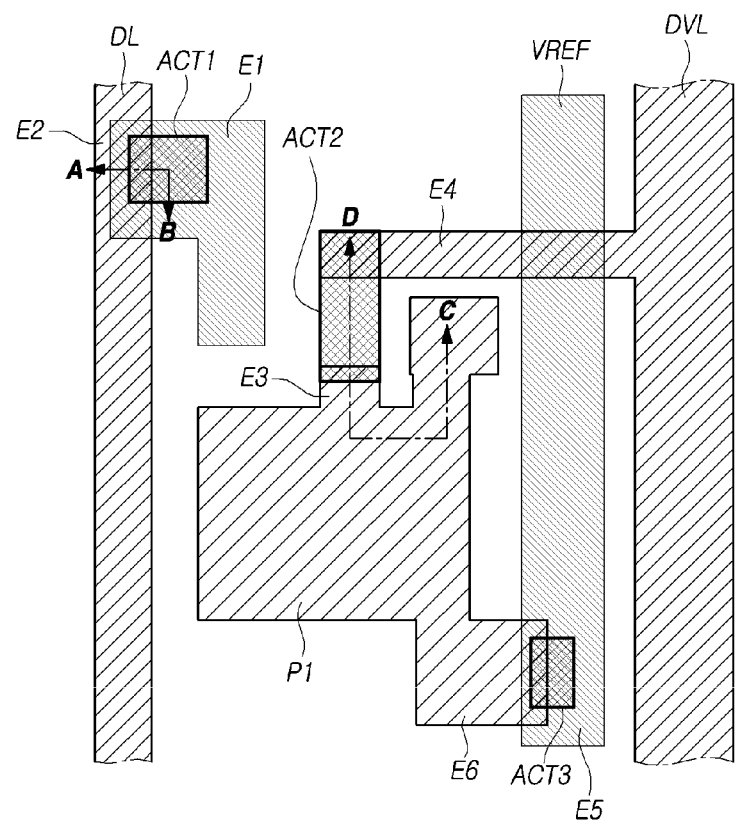
Figure 12:
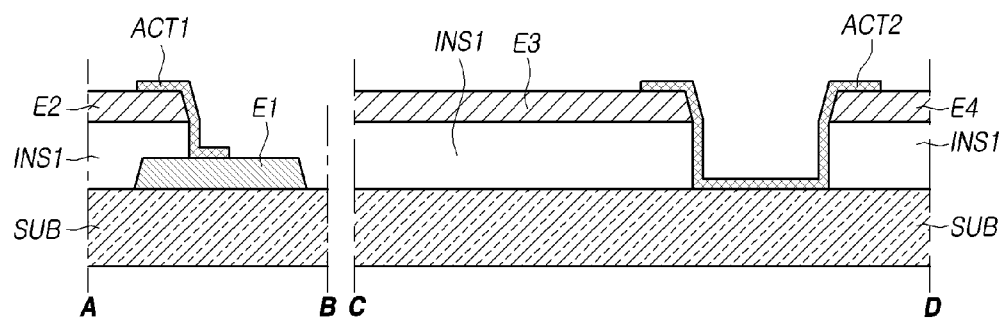

Afterwards, as illustrated in FIG. 12, the first, second and third active layers ACT1, ACT2, and ACT3 are fabricated. The first active layer ACT1 can overlap the first and second electrodes E1 and E2 of the first transistor T1, the second active layer ACT2 can overlap the third and fourth electrodes E3 and E4 of the second transistor T2, and the third active layer ACT3 can overlap the fifth and sixth electrodes E5 and E6 of the third transistor T3.

For example, the first to third active layers ACT1, ACT2, and ACT3 can be fabricated by a thin-film deposition method, such as metal-organic chemical vapor deposition (MOCVD) or atomic layer deposition (ALD), in which thin-film deposition processing is controllable.

The MOCVD method is a subclass of chemical vapor deposition (CVD), used to fabricate a thin film by a deposition reaction on the surface of a hot substrate onto which reactant gases are injected. The reactant gases contain an organometallic complex. The MOCVD method is a technique of growing a semiconductor thin film by decomposing organometallic gases on the hot substrate by heat. The MOCVD method is performed at a lower temperature than other CVD methods, such as plasma enhanced chemical vapor deposition (PECVD) and low-pressure chemical vapor deposition (LPCVD). Thin film processing can be controlled at the atomic level, so that a uniform thin film can be fabricated.

The ALD method is a subclass of CVD, used to fabricate a thin film by separately supplying reactants and depositing particles, produced by chemical reaction of reactant gases, on the surface of a substrate. After chemical adsorption of one reactant to the substrate, a second gas or a third gas is supplied to the substrate, causing subsequent chemical adsorption to the substrate, so that a thin film is deposited on the substrate.

The use of the MOCVD or ALD method can improve the productivity or growth rate of a thin film, compared to physical vapor deposition (PVD) methods or other CVD methods. In addition, due to high thin film coating performance, the thickness of the thin film can be precisely adjusted. That is, the use of the MOCVD or ALD method can fabricate a thin film having excellent step-coverage properties.

In addition, the MOCVD or ALD method can fabricate a thin film having a higher thickness and composition uniformity, as well as a higher level of density, compared to other deposition methods, such as sputtering.

The first to third active layers ACT1, ACT2, and ACT3, fabricated by the MOCVD or ALD method, can be very thin films fabricated without a break, e.g., no discontinuity in an electrical circuit, even in a stepped area.

Figure 13:
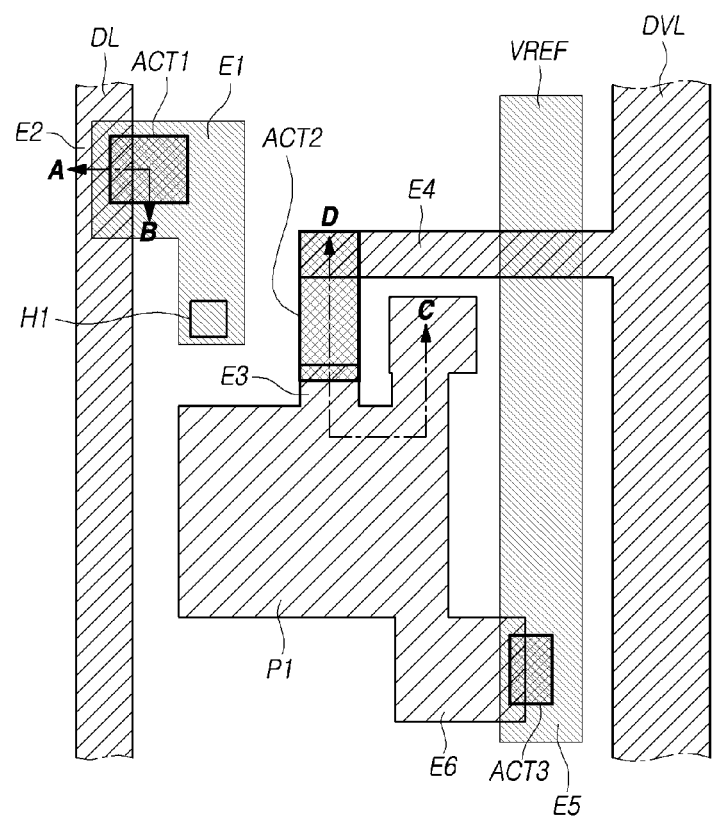
Figure 13:
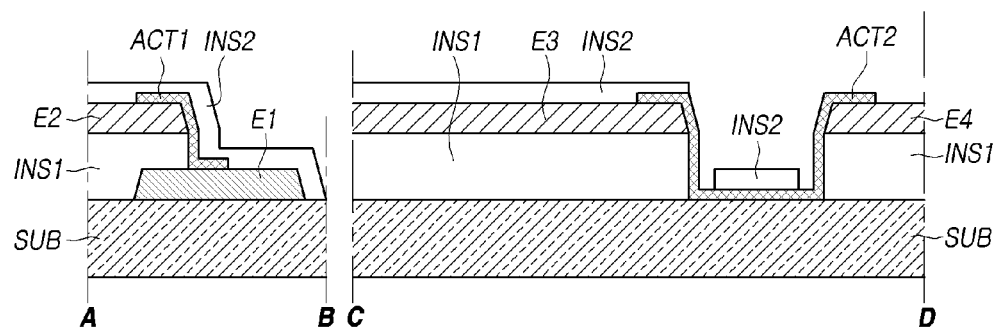

Afterwards, as illustrated in FIG. 13, the second insulating film INS2 is fabricated to overlap the first to third active layers ACT1, ACT2, and ACT3. Here, the second insulating film INS2 can also be fabricated on the first plate P1.

The second insulating film INS2 may be fabricated by the MOCVD or ALD method. Accordingly, the second insulating film INS2 can have a smaller thickness variation and a higher level of density, compared to the first insulating film INS1.

The second insulating film INS2 can be made of a high-dielectric-constant material to increase the capacity of the storage capacitor Cst. For example, the second insulating film INS2 can contain at least one material selected from among, but not limited to, $HfO_2$, $ZrO_2$, $Ta_2O_5$, $TiO_2$, or $Y_2O_3$.

In addition, the second insulating film INS2 can be fabricated to have a thin thickness to increase the capacity of the storage capacitor Cst. For example, the thickness of the second insulating film INS2 can be thinner than the thickness of the first insulating film INS1.

Figure 14:
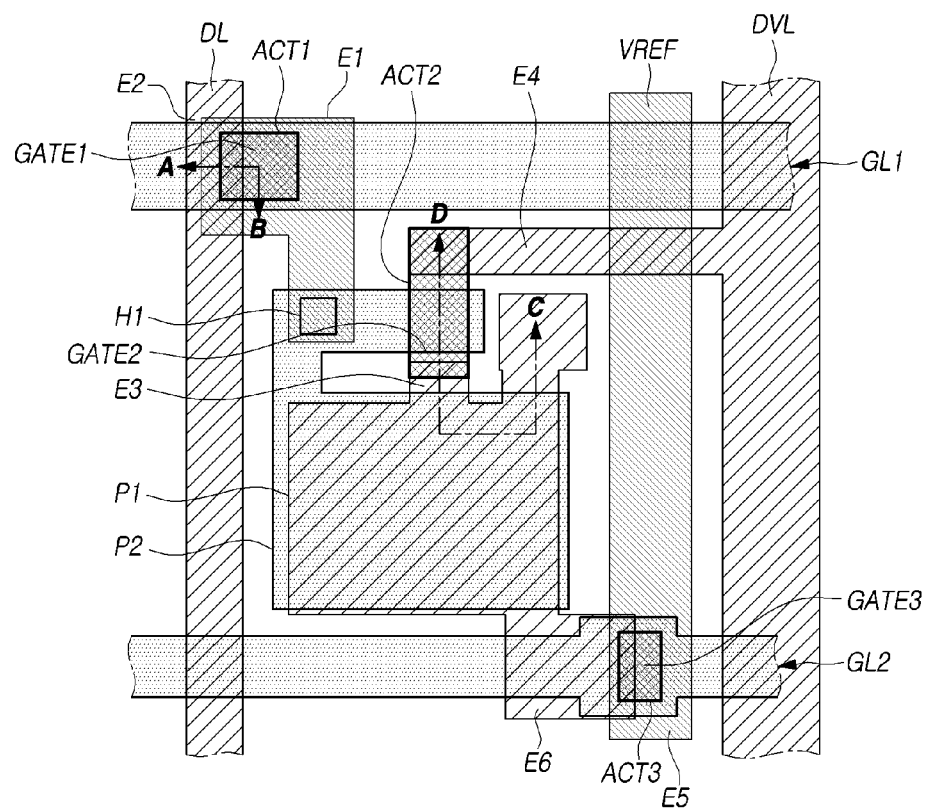
Figure 14:
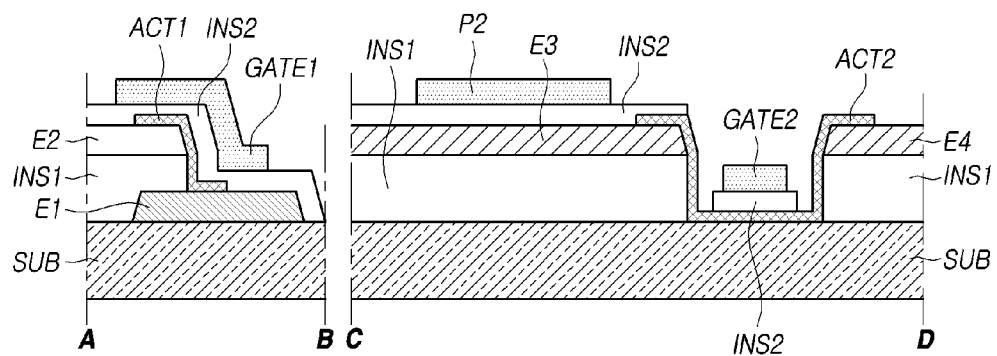

Afterwards, as illustrated in FIG. 14, the first gate line GL1, the second plate P2, and the second gate line GL2 are fabricated.

Here, the first gate line GL1 can be the first gate electrode GATE1 of the first transistor T1, the second plate P2 can be the second gate electrode GATE2 of the second transistor T2, and the second gate line GL2 can be the third gate electrode GATE3 of the third transistor T3.

Figure 15:
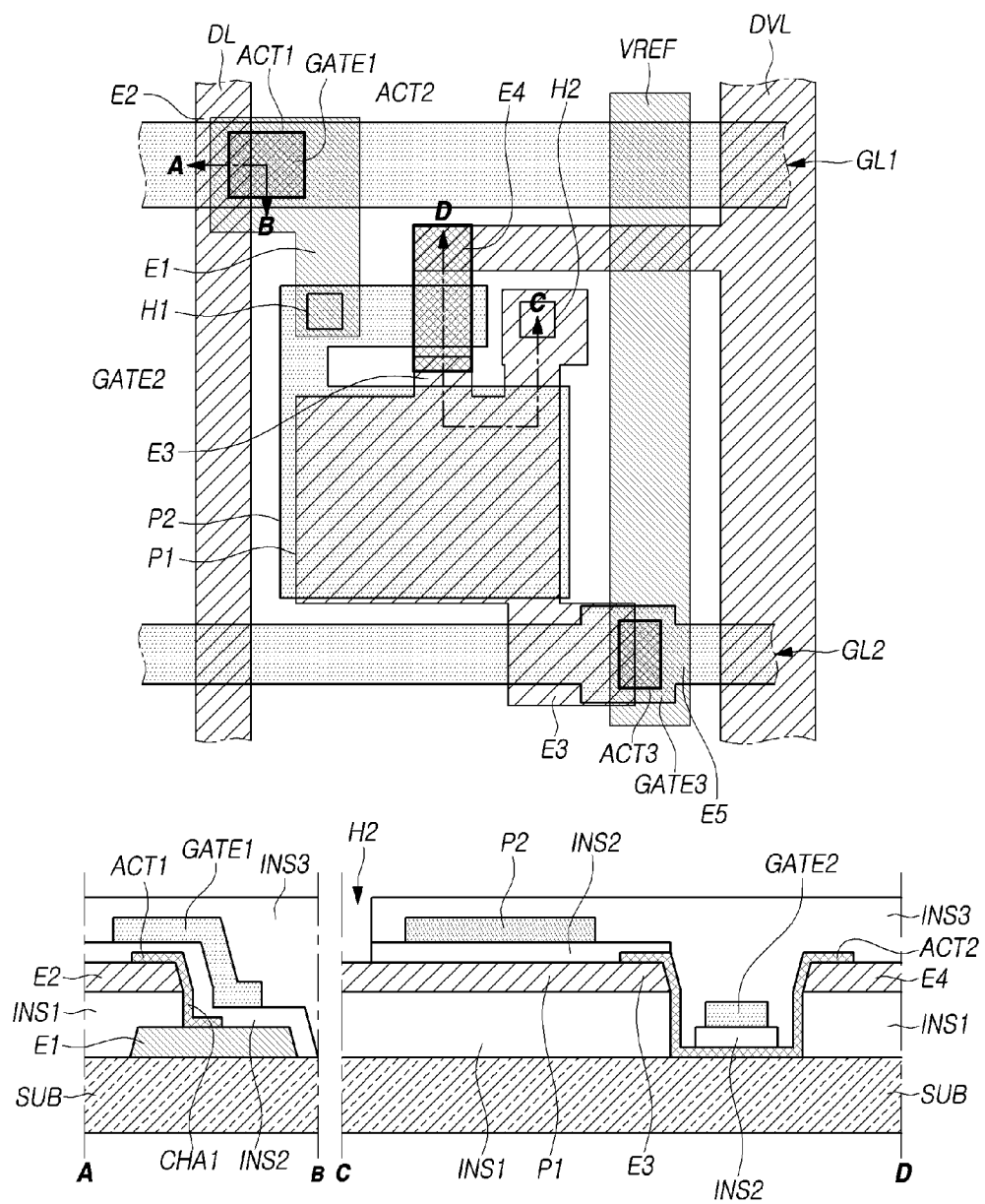

Afterwards, as illustrated in FIG. 15, the third insulating film INS3 is fabricated on the substrate SUB on which the first gate line GL1, the second plate P2, and the second gate line GL2 are fabricated.

The third insulating film INS3 can also be fabricated by the MOCVD or ALD method. Accordingly, the third insulating film INS3 can have a smaller thickness variation and a higher level of density, compared to the first insulating film INS1 (e.g., thickness of the third insulating film INS3 can be more uniformly maintained than the thickness of the first insulating film INS1, which has more variations in its thickness).

In addition, the third insulating film INS3 can be made of a high-dielectric-constant material to increase the capacity of the storage capacitor Cst. For example, the third insulating film INS3 can contain at least one material selected from among, but not limited to, $HfO_2$, $ZrO_2$, $Ta_2O_5$, $TiO_2$, or $Y_2O_3$.

In addition, the third insulating film INS3 can be fabricated to have a thin thickness to increase the capacity of the storage capacitor Cst. For example, the thickness of the third insulating film INS3 can be thinner than the thickness of the first insulating film INS1.

In addition, as illustrated in FIG. 15, the second hole H2 can be formed in the third insulating film INS3 to expose a portion of the first plate P1.

Figure 16:
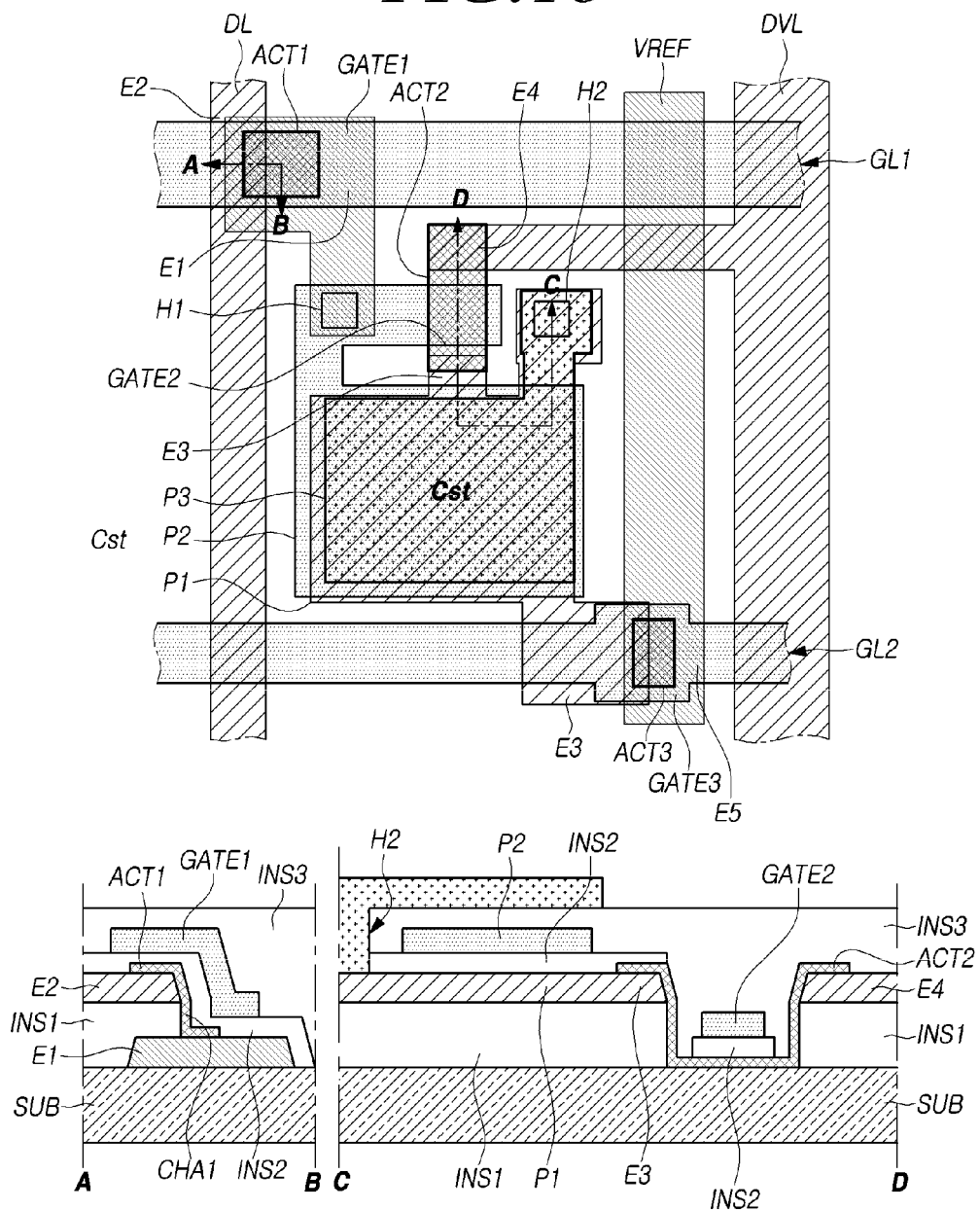

Afterwards, referring to FIG. 16, the third plate P3 can be fabricated on the third insulating film INS3.

The third plate P3 can be electrically connected to the first plate P1 via the second hole H2 formed in the second insulating film INS2 and the third insulating film INS3.

Although the foregoing descriptions with reference to FIGS. 6 to 16 have been focused on the configuration in which two gate lines GL1 and GL2 are disposed in a single subpixel SP and three transistors T1, T2, and T3 are provided in the subpixel SP, the present disclosure is not limited thereto. For example, a single gate line GL1 can be disposed on a single subpixel SP while three transistors T1, T2, and T3 are provided in the subpixel SP.

This configuration will be described hereinafter with reference to FIG. 17.

Figure 17:
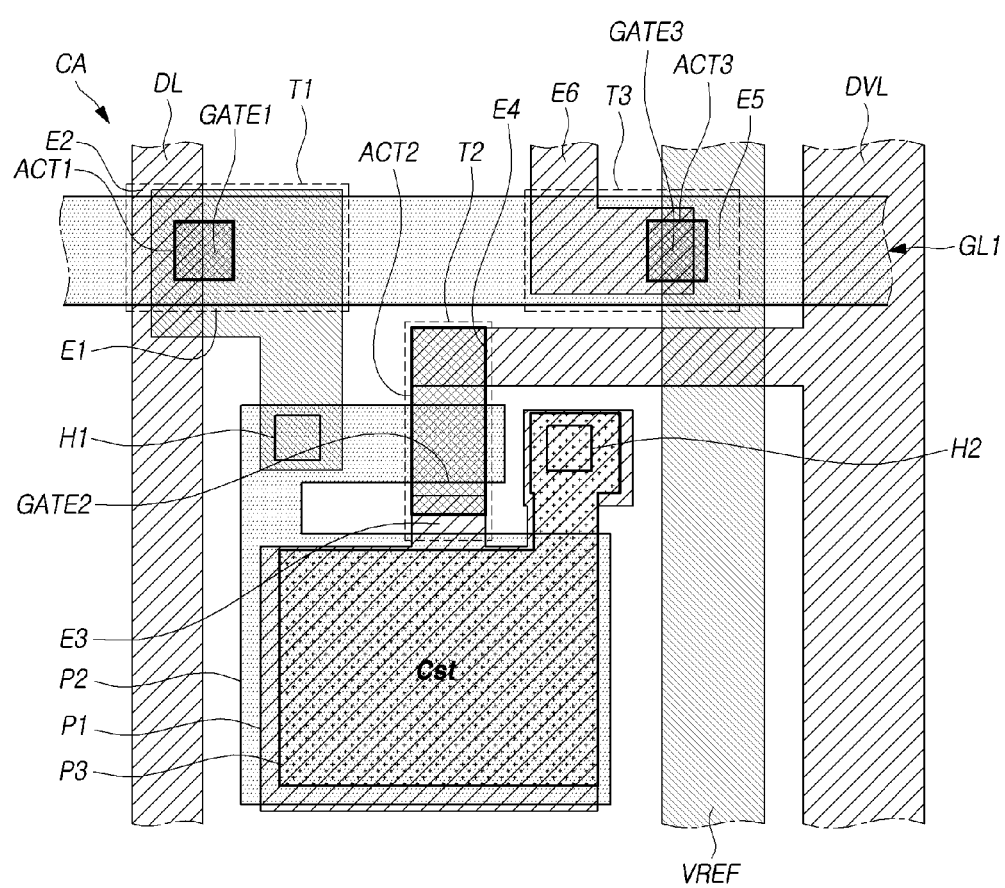
FIG. 17 illustrates a circuit area of a subpixel according to another embodiment.

FIG. 17 illustrates a circuit area of a subpixel according to another embodiment.

Referring to FIG. 17, a circuit area CA, included in a single subpixel SP, can include three transistors T1, T2, and T3 and a single storage capacitor Cst.

In the single subpixel SP, a data line DL extending in a single direction, as well as a driving voltage line DVL and a reference voltage line VREF parallel to the data line DL, can be disposed in the single subpixel SP.

In addition, a single gate line (or a scan line) GL1 can be disposed to intersect the data line DL, the driving voltage line DVL, and the reference voltage line VREF.

Comparing FIG. 17 with FIG. 16, the position of the third transistor T3 can be different (e.g., rather than being disposed at the lower right-hand corner, the third transistor T3 can be disposed at the upper right-hand corner of the circuit area CA).

Specifically, the first transistor T1 and the third transistor T3 can be configured to share the gate line GL1. Here, the gate line GL1 can serve as the first gate electrode GATE1 of the first transistor T1 and as the third gate electrode GATE3 of the third transistor T3.

According to an embodiment, the third transistor T3 includes the fifth electrode E5, the third active layer ACT3, the sixth electrode E6, and the third gate electrode GATE3.

The reference voltage line VREF can serve as the fifth electrode E5. In addition, the third active layer ACT3 can be disposed to overlap a portion of the reference voltage line VREF.

In addition, the sixth electrode E6 can be disposed to overlap the reference voltage line VREF and the third active layer ACT3.

Here, the sixth electrode E6 can be disposed on the same layer as the data line DL and the driving voltage line DVL.

In addition, the gate line GL can be disposed to overlap the reference voltage line VREF, the third active layer ACT3, and the sixth electrode E6.

According to the present embodiment, only the single gate line GL1 may be present in the single subpixel SP, since the first transistor T1 and the third transistor T3 share the single gate line GL1, as described above.

In this situation, the area of the single subpixel SP, occupied by the single gate line, can be reduced to be smaller than the area of the single subpixel SP, occupied by two gate lines, such that the effect of further reducing the size of the circuit area CA can be obtained.

According to embodiments, in the thin-film transistor array substrate and the electronic device including the same, at least one transistor, among a plurality of transistors disposed in a panel, has a structure by which a short channel and integration can be realized.

According to embodiments, in the thin-film transistor array substrate and the electronic device including the same, at least one transistor, among a plurality of transistors disposed in a panel, has a structure by which an operating margin is increased due to a high S-factor.

According to embodiments, the thin-film transistor array substrate includes a transistor having a structure by which an ultra-high resolution panel can be realized due to a reduced device area, and the electronic device includes the same thin-film transistor array substrate.

According to embodiments, the thin-film transistor array substrate includes a transistor having a structure by which an active layer and an insulating film are protected from a break, e.g., a discontinuity in an electrical circuit, and the electronic device includes the same thin-film transistor array substrate.

According to embodiments, the thin-film transistor array substrate includes a storage capacitor having increased capacity, and the electronic device includes the same thin-film transistor array substrate.

The foregoing descriptions and the accompanying drawings have been presented in order to explain certain principles of the present disclosure by way of example. A person having ordinary skill in the art to which the present disclosure relates could make various modifications and variations by combining, dividing, substituting for, or changing the elements without departing from the principle of the present disclosure. The foregoing embodiments disclosed herein shall be interpreted as being illustrative, while not being limitative, of the principles and scope of the present disclosure. It should be understood that the scope of the present disclosure shall be defined by the appended Claims and all of their equivalents fall within the scope of the present disclosure.

What is claimed is:

1. An electronic device comprising:
a panel;
a driver circuit configured to drive the panel; and
first and second transistors disposed in the panel, the first and second transistors including:
a first electrode of the first transistor, the first electrode being disposed on a substrate;
a first insulating film disposed on the substrate, overlapping an edge of the first electrode and having an open area for receiving portions of the second transistor;
a second electrode of the first transistor, the second electrode being disposed on the first insulating film and overlapping with a portion of the first electrode;
third and fourth electrodes of the second transistor, the third electrode and the fourth electrode being disposed on a same layer as the second electrode and spaced apart from the second electrode, the open area of the first insulating film being disposed between the third electrode and the fourth electrode;
a first active layer of the first transistor, the first active layer being disposed on the first electrode, the first insulating film and the second electrode; and
a second active layer of the second transistor, the second active layer being disposed on the third and fourth electrodes and across the open area of the first insulating film.

2. The electronic device according to claim 1, further comprising:
a second insulating film disposed on the first active layer, the second active layer and the third electrode; and
a first gate electrode of the first transistor and a second gate electrode of the second transistor, the first gate electrode being disposed on the second insulating film and overlapping with the first active layer, and the second gate electrode being disposed on the second insulating film and overlapping with the second active layer.

3. The electronic device according to claim 1, wherein the first active layer includes a first channel area disposed along a side surface of the first insulating film, and
wherein the first channel area is non-parallel to the substrate.

4. The electronic device according to claim 1, wherein a plurality of data lines intersect a plurality of gate lines within the panel, and
wherein the first active layer of the first transistor overlaps one data line among the plurality of data lines and one gate line among the plurality of gate lines.

5. The electronic device according to claim 2, further comprising:
a first plate of a storage capacitor integral with the third electrode;
a second plate of the storage capacitor disposed on the first plate;
a third insulating film disposed on the second plate; and
a third plate of the storage capacitor disposed on the third insulating film.

6. The electronic device according to claim 5, wherein the first plate and the third plate are electrically connected to each other via a first hole extending through the second and third insulating films.

7. The electronic device according to claim 5, wherein the second plate is integral with the second gate electrode of the second transistor.

8. The electronic device according to claim 5, wherein the second insulating film is denser than the first insulating film, and
wherein the second insulating film has less thickness variation than the first insulating film, or the second insulating film has a more uniform thickness than the first insulating film.

9. The electronic device according to claim 2, wherein one of the first and second electrodes of the first transistor is electrically connected to both the second gate electrode of the second transistor and a storage capacitor.

10. The electronic device according to claim 1, wherein the second transistor is configured to receive a data voltage.

11. The electronic device according to claim 1, wherein the first active layer includes a first channel area, and
wherein the first channel area contacts a side surface of the first insulating film.

12. The electronic device according to claim 2, wherein the second active layer includes a conductive area, the conductive area non-overlapping with the second gate electrode, and wherein the conductive area of the second active layer includes at least one sloped area.

13. The electronic device according to claim 12, wherein the at least one sloped area includes a region corresponding to at least one side of the third or fourth electrodes of the second transistor.

14. The electronic device according to claim 1, wherein the second gate electrode is disposed closer to the substrate than the third and fourth electrodes of the second transistor.

15. The electronic device according to claim 2, wherein the panel further includes a third transistor disposed on the substrate, the third transistor including:
a fifth electrode disposed on the substrate;
the first insulating film exposing an edge of the fifth electrode and a portion of a top surface of the substrate;
a sixth electrode disposed on the first insulating film;
a third active layer disposed on the sixth electrode, the first insulating film and the fifth electrode, the third active layer of the third transistor including a third channel area contacting a side surface of the first insulating film; and
a third gate electrode disposed on the second insulating film and overlapping with the third active layer.

16. The electronic device according to claim 15, wherein one of the fifth and sixth electrodes of the third transistor is electrically connected to the third electrode or the fourth electrode of the second transistor.

17. The electronic device according to claim 15, wherein a plurality of reference voltage lines are disposed within the panel to be parallel to a plurality of data lines intersecting a plurality of gate lines, and
wherein the third active layer overlaps with one reference voltage line among the plurality of reference voltage lines and one gate line among the plurality of gate lines.

18. The electronic device according to claim 17, wherein the fifth electrode of the third transistor is integral with the one reference voltage line overlapped with the third active layer.

19. The electronic device according to claim 17, wherein the one gate line overlapped with the third active layer also overlaps with the first active layer.

20. The electronic device according to claim 17, wherein the third active layer and the first active layer overlap with different gate lines among the plurality of gate lines.

21. The electronic device according to claim 15, wherein each of a plurality of subpixels in an active area of the panel includes the first, second and third transistors.

22. The electronic device according to claim 21, further comprising:
a third insulating film disposed on the third and fourth electrodes of the second transistor; and
a pixel electrode disposed on the third insulating film, the pixel electrode being electrically connected to the third or fourth electrode via a second hole in the second and third insulating films.

23. The electronic device according to claim 15, wherein at least one transistor among the first, second, and third transistors is included in a gate driver circuit disposed in a non-active area in a periphery of an active area of the panel.

24. A thin-transistor array substrate comprising:
a substrate;
a first electrode of a first transistor being disposed on the substrate;
a first insulating film disposed on the substrate, overlapping an edge of the first electrode and having an open area for receiving portions of a second transistor;
a second electrode of the first transistor being disposed on the first insulating film and overlapping with a portion of the first electrode;
third and fourth electrodes of the second transistor being disposed on a same layer as the second electrode and spaced apart from the second electrode, the open area of the first insulating film being disposed between the third electrode and the fourth electrode;
a first active layer of the first transistor being disposed on the first electrode, the first insulating film and the second electrode; and
a second active layer of the second transistor being disposed on the third and fourth electrodes and across the open area of the first insulating film.

25. The thin-transistor array substrate according to claim 24, further comprising:
a second insulating film disposed on the first active layer, the second active layer, and the third electrode; and
a first gate electrode of the first, transistor and a second gate electrode of the second transistor, the first gate electrode being disposed on the second insulating film and overlapping with the first active layer, and the second gate electrode being disposed on the second insulating film and overlapping with the second active layer.

* * * * *